US012660683B1

(12) United States Patent
Ross et al.

(10) Patent No.: US 12,660,683 B1
(45) Date of Patent: Jun. 16, 2026

(54) TILE STRUCTURES FOR MULTIPLE DIE TENSOR STREAMING PROCESSORS

(71) Applicant: Groq, Inc., Mountain View, CA (US)

(72) Inventors: Jonathan Alexander Ross, Palo Alto, CA (US); Dinesh Maheshwari, Fremont, CA (US)

(73) Assignee: Groq, Inc., San Jose, CA (US)

( * ) Notice: Subject to any disclaimer, the term of this patent is extended or adjusted under 35 U.S.C. 154(b) by 0 days.

(21) Appl. No.: 17/678,988

(22) Filed: Feb. 23, 2022

Related U.S. Application Data

(60) Provisional application No. 63/152,726, filed on Feb. 23, 2021.

(51) Int. Cl.
| | |
|---|---|
| *H10W 90/00* | (2026.01) |
| *H10W 90/20* | (2026.01) |
| *H10W 90/24* | (2026.01) |

(52) U.S. Cl.
CPC ............ *H10W 90/00* (2026.01); *H10W 90/24* (2026.01); *H10W 90/288* (2026.01); *H10W 90/297* (2026.01)

(58) Field of Classification Search
CPC ....... H01L 25/0652; H01L 2225/06541; H01L 2225/06562; H01L 2225/06589; H01L 25/065; H01L 24/95; H01L 23/5386; H01L 23/5385; H01L 25/50; H01L 25/0655; H01L 23/5381; H01L 23/5384; H01L 2224/16227; H01L 2224/131;

H01L 2224/16145; H01L 24/16; H01L 2224/17181; H01L 2224/14133; H01L 2224/14134; H01L 2924/014; H01L 2924/00014

See application file for complete search history.

(56) References Cited

U.S. PATENT DOCUMENTS

| | | | | |
|---|---|---|---|---|
| 2018/0075929 A1* | 3/2018 | Kim | ....................... | G11C 29/76 |
| 2018/0102311 A1* | 4/2018 | Shih | ................. | H01L 23/49827 |
| 2018/0331042 A1* | 11/2018 | Manusharow | ........ | H01L 23/642 |

(Continued)

OTHER PUBLICATIONS

Beyne, E. et al., "3D SoC integration, beyond 2.5D chiplets," 2021 IEEE International Electron Devices Meeting (IEDM), Dec. 2021, pp. 1-4.

(Continued)

*Primary Examiner* — Kretelia Graham
*Assistant Examiner* — William Henry Anderson
(74) *Attorney, Agent, or Firm* — Dority & Manning, P.A.

(57) ABSTRACT

Embodiments are directed to an integrated circuit with one or more tile structures. The integrated circuit can include a first die and a second die connected to the first die forming a tile structure. The first die is shifted relative to the second die by a first shift amount along a first dimension and by a second shift amount along a second dimension orthogonal to the first dimension. The integrated circuit can further include an array of tile structures. Each tile structure in the array includes a first die, and a second die connected to the first die in a face-to-face configuration. The first die is shifted relative to the second die by a first shift amount along a first dimension and by a second shift amount along a second dimension orthogonal to the first dimension forming an offset alignment between the first die and the second die.

20 Claims, 21 Drawing Sheets

(56) References Cited

U.S. PATENT DOCUMENTS

| | | | | |
|---|---|---|---|---|
| 2019/0131976 A1* | 5/2019 | Chandrasekar | ..... | H01L 23/5385 |
| 2019/0304915 A1* | 10/2019 | Jain | ......................... | H01L 28/20 |
| 2020/0098692 A1* | 3/2020 | Liff | ..................... | H01L 23/5386 |
| 2020/0118908 A1* | 4/2020 | Yu | ........................ | H01L 23/3677 |
| 2020/0211147 A1* | 7/2020 | Doyle | ................... | G06F 9/5077 |
| 2021/0020529 A1* | 1/2021 | McHerron | ............ | H01L 23/538 |
| 2021/0111147 A1* | 4/2021 | Liff | ....................... | H10W 90/00 |
| 2021/0151408 A1* | 5/2021 | Yu | ........................... | H01L 24/08 |
| 2021/0390664 A1* | 12/2021 | Pohl | ...................... | G06T 15/005 |
| 2022/0223530 A1* | 7/2022 | Yu | ........................... | H10P 72/74 |
| 2022/0230991 A1* | 7/2022 | Jiang | .................. | H01L 25/0652 |
| 2022/0262766 A1* | 8/2022 | Chen | .................. | H10W 70/614 |

OTHER PUBLICATIONS

Lau, J.H., "Status and Outlooks of Flip Chip Technology," Nov. 14, 2018, pp. 1-16.

* cited by examiner

Tile Structure
200
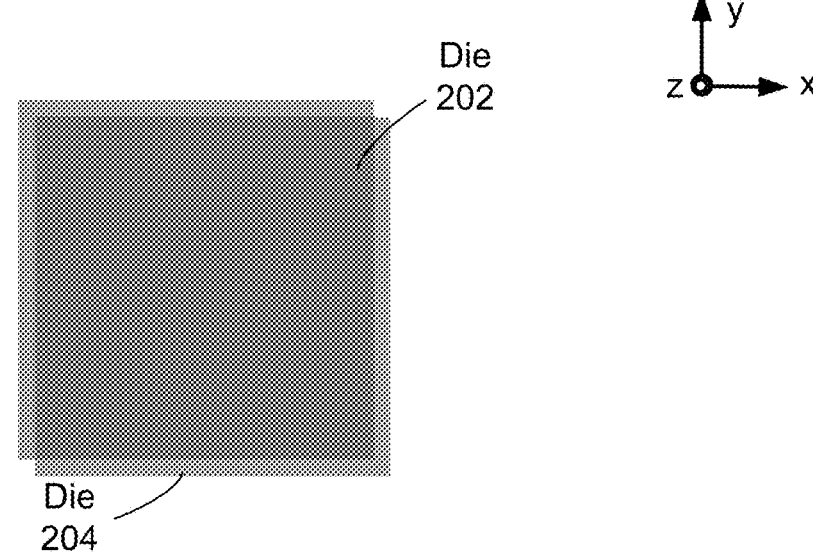
Die
202
Die
204
Tile Structure
(Side View)
200
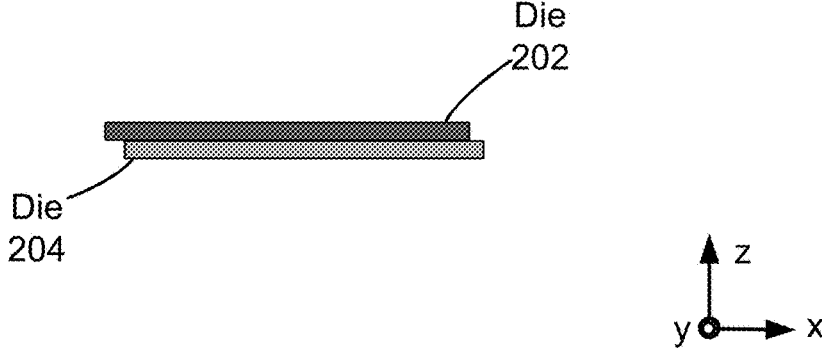
Die
202
Die
204
FIG. 2A

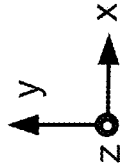
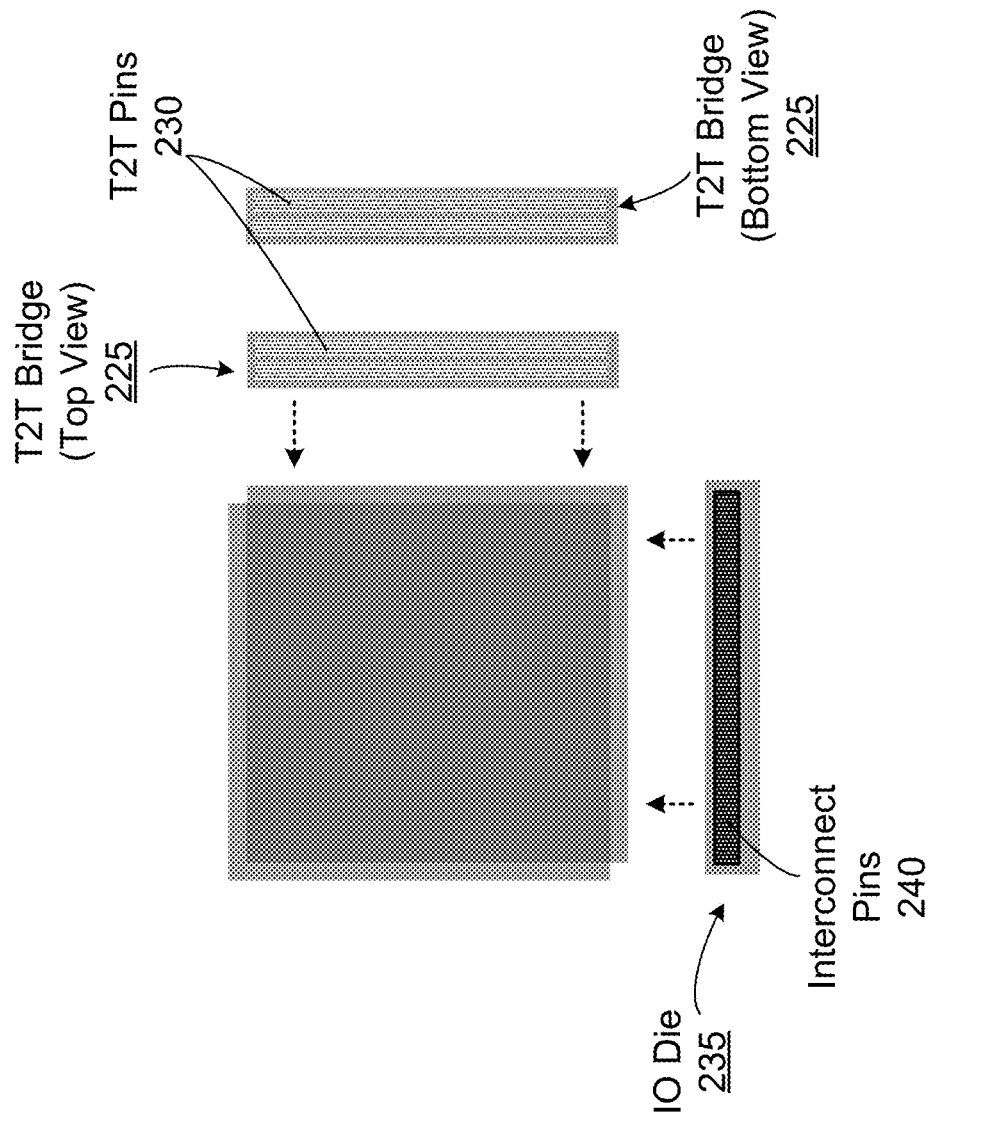
*FIG. 2C*

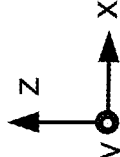
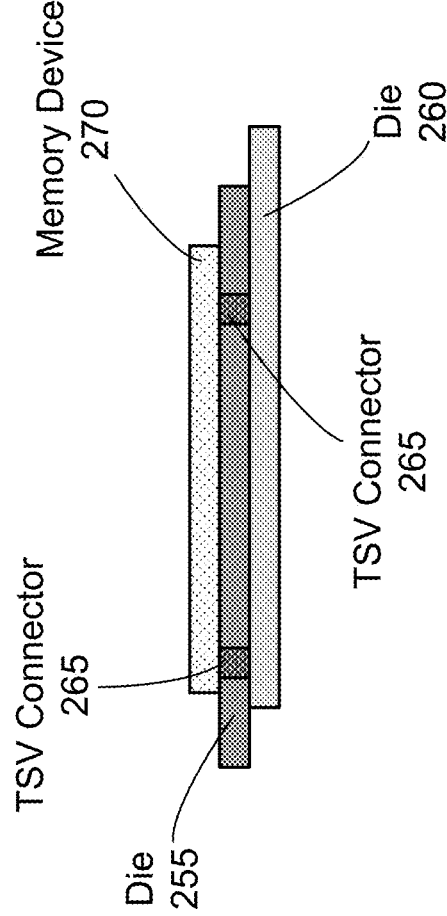
*FIG. 2D*

Integrated Circuit
520

Die
525(1)

Die
525(2)

Die
525(3)

Die
530A

Die
530B

Die
525(4)

Die
525(5)

Die
530C

Die
530D

Die
525(6)

Die
525(7)

Die
525(8)

Die
525(9)

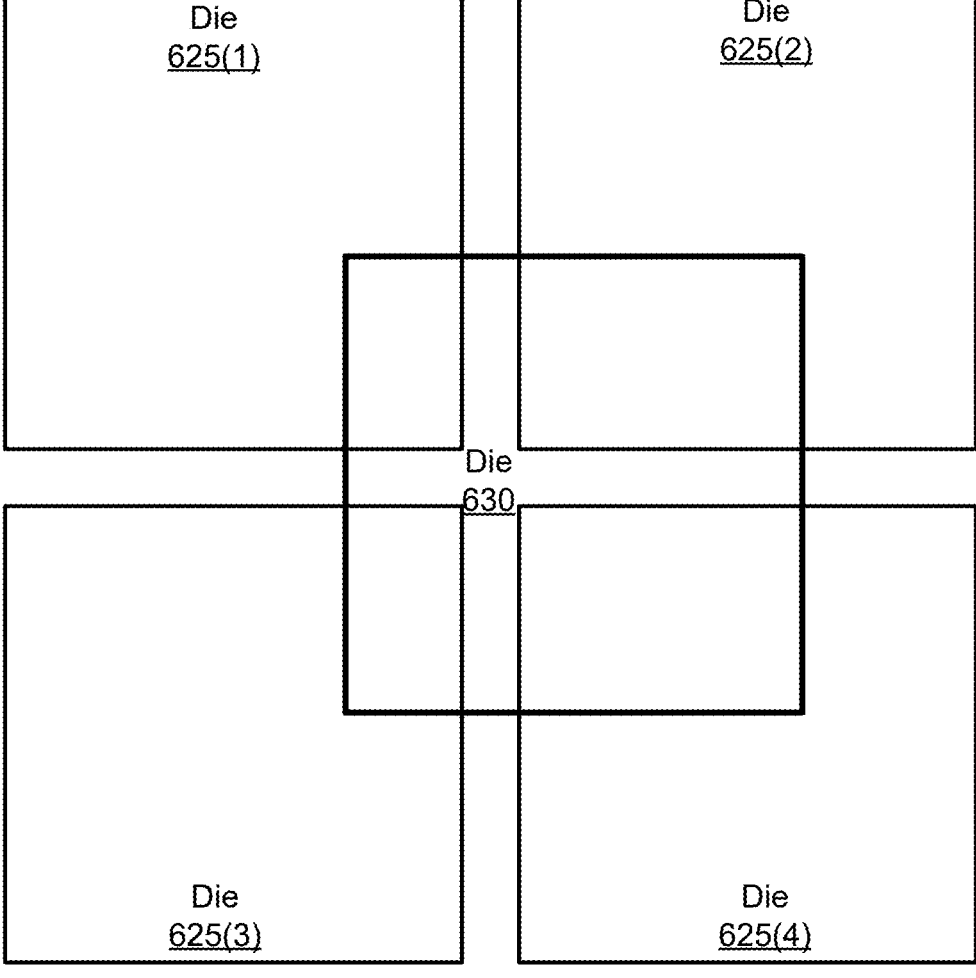
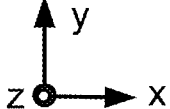
*FIG. 6B*

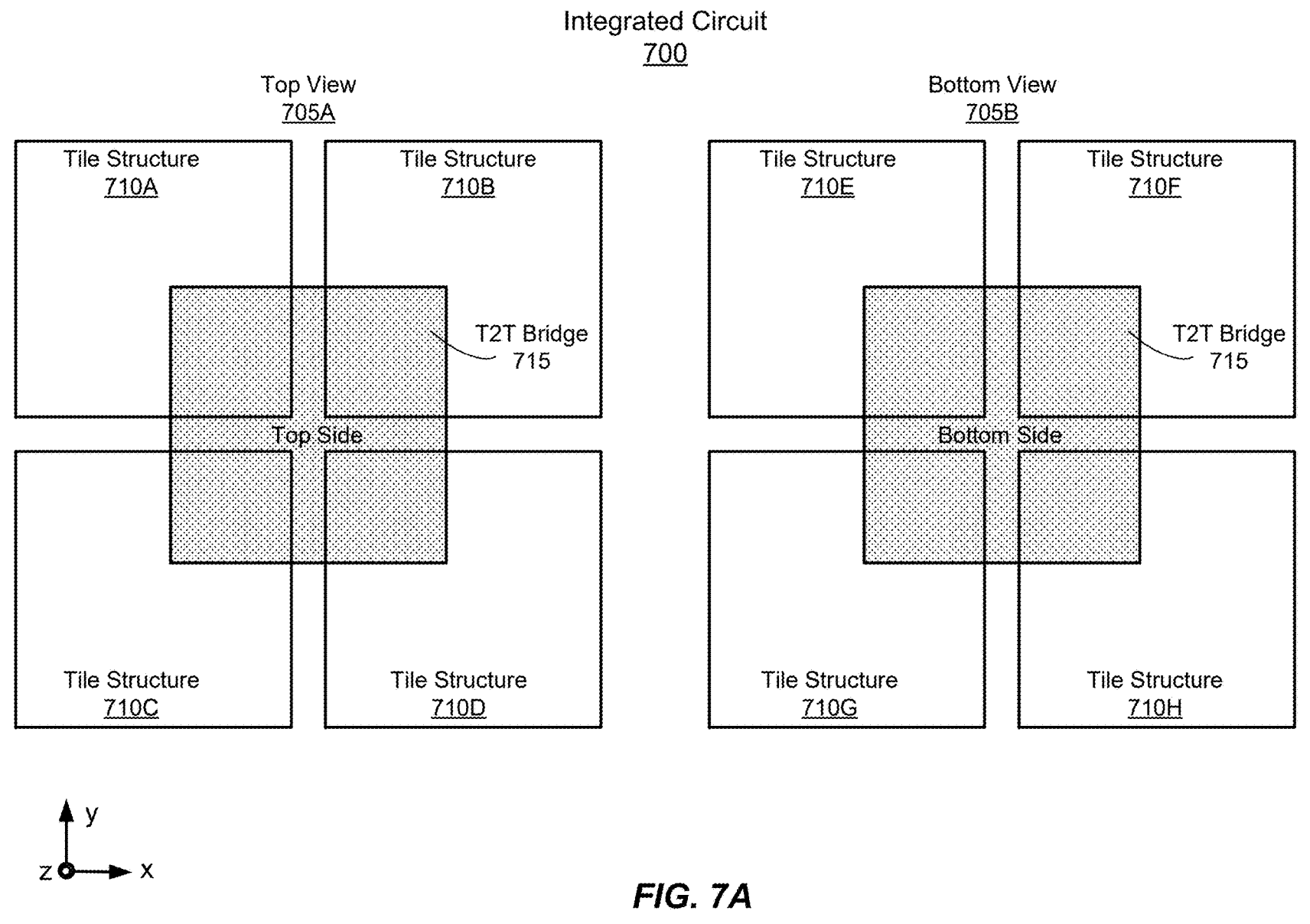

Integrated Circuit
700

Top View
705A

Tile Structure
710A

Tile Structure
710B

Tile Structure
710C

Tile Structure
710D

T2T Bridge
715

Top Side

Bottom View
705B

Tile Structure
710E

Tile Structure
710F

Tile Structure
710G

Tile Structure
710H

T2T Bridge
715

Bottom Side

*FIG. 7A*

Integrated Circuit
800

Integrated Circuit
820

Cuboid Structure N*M*K (e.g., N=3, M=3, K=4)

Tile Structure

Tile Structure

Tile Structure

Tile Structure

Tile Structure

Tile Structure

Tile Structure

Tile Structure

Tile Structure

Figure 10:
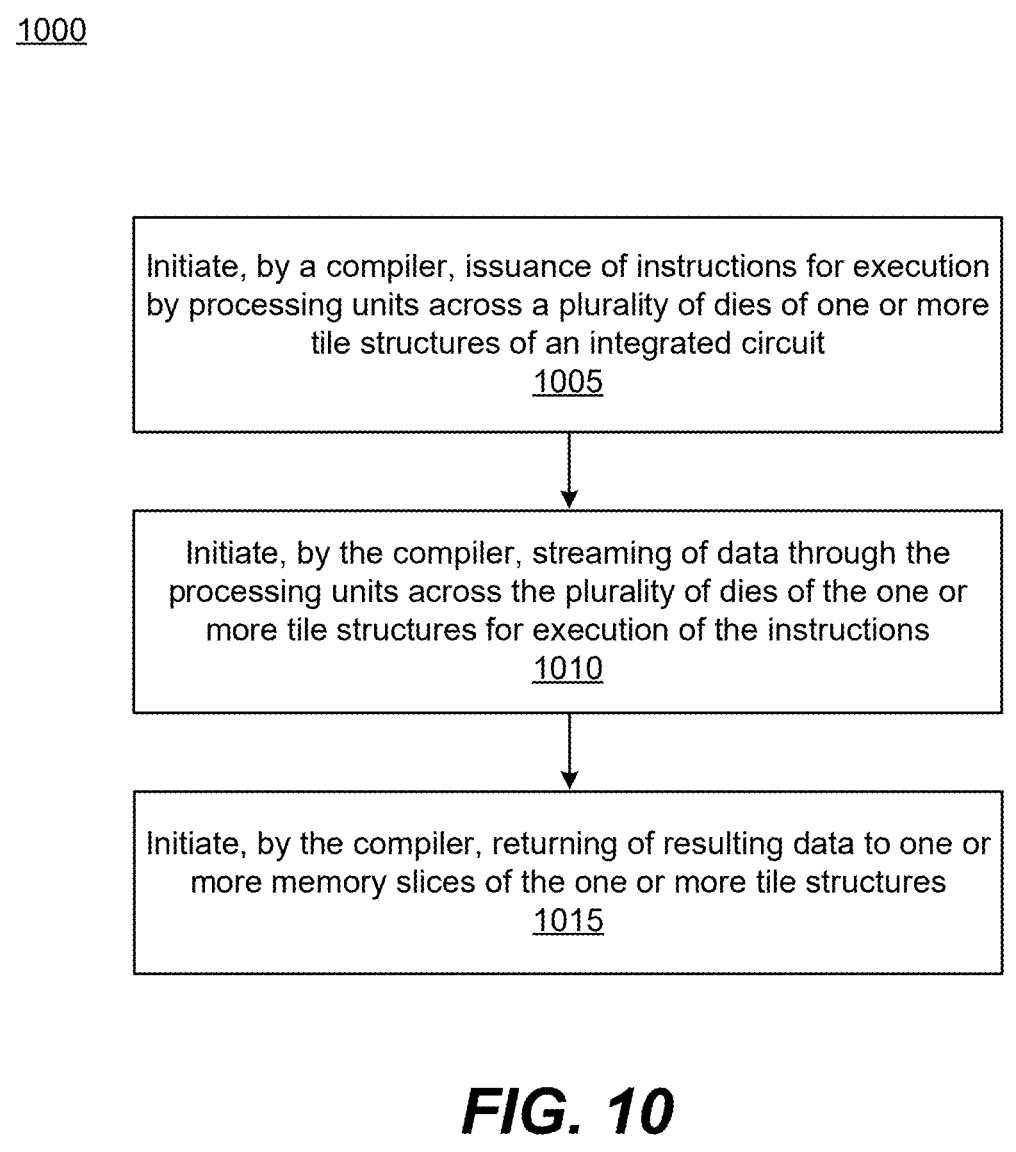

Initiate, by a compiler, issuance of instructions for execution
by processing units across a plurality of dies of one or more
tile structures of an integrated circuit
1005

Initiate, by the compiler, streaming of data through the
processing units across the plurality of dies of the one or
more tile structures for execution of the instructions
1010

Initiate, by the compiler, returning of resulting data to one or
more memory slices of the one or more tile structures
1015

TILE STRUCTURES FOR MULTIPLE DIE TENSOR STREAMING PROCESSORS

CROSS-REFERENCE TO RELATED APPLICATIONS

This application claims a benefit and priority to U.S. Provisional Patent Application Ser. No. 63/152,726, filed on Feb. 23, 2021, entitled "Face-to-Face Tile Structures for Multiple Die Processors", which is hereby incorporated by reference in its entirety.

TECHNICAL FIELD

The present disclosure generally relates to multiple die processors, and more specifically to tile structures for multiple die tensor streaming processors.

BACKGROUND

Over the last decade, data center operators have installed multicore processor systems in warehouse-scale computers. These systems have dozens to thousands of processing cores that vary widely in form and function, are used in powerful graphical processing units (GPUs), tensor processing units (TPUs), field programmable gate arrays (FPGAs), with many using data network controllers for efficient remote memory access. Such systems are often used for accelerating deep neural network training and inference (application of the trained neural network) performance for a wide range of uses in commerce, for example, convolutional neural networks (CNNs) for recommendation algorithms, computer vision and image classification for product searching; and recurrent neural networks (RNNs) for natural language processing in user interfaces. The heightened computational requirements of these models, many of which involve very large numbers of vector and matrix calculations, when used for millions of consumers and billions of transactions, have been the catalyst for a resurgence of architectural innovation.

In a conventional chip multiprocessor (CMP), processing cores are interconnected using an on-chip network to exchange data between all of the processing cores. In this simple load-store model, a set of general-purpose data registers are used as intermediate storage between the main memory systems and the processor cores, which can include arithmetic logic units (ALUs), that operate on data. Instructions are dispatched to each core and executed by the local integer or floating-point processing modules, while intermediate results are stored in the general-purpose registers. This load-store architecture moves data (also referred to as 'operands') and computed results between the registers and main memory. Instruction execution is often carried out over several stages: 1) instruction fetch, 2) instruction decode, 3) execution on ALUs, 4) memory read, and 5) memory write to update the results in the registers.

However, workloads for CMPs continue to grow both in size and complexity, presenting serious scalability, performance, and usability demands for traditional CMP architectures. Efficiently managing this demand requires abundant on-chip ALUs for the vector and matrix calculations, used at near-peak performance levels throughout program execution. Unfortunately, hardware complexity from added ALUs and other components substantially increased scheduling difficulties within many of these architectures. In turn, this impedes system performance as it is difficult to prevent runtime stalls. Furthermore, while architectural enhancements such as caches, branch predictors, and prefetchers help tremendously in improving performance, they do not bound worst-case performance.

SUMMARY

Embodiments of the present disclosure are directed to an integrated circuit with one or more deterministic processors (e.g., tensor streaming processors (TSPs) or artificial intelligence processors) each having a functional slice architecture. In some embodiments, each deterministic processor is configured to process a machine learning model. Each deterministic processor is divided into a plurality of functional units organized into a plurality of functional slices. Each functional slice is configured to perform specific functions within the deterministic processor, which may include memory functional slices (MEMs) for storing operand data, arithmetic functional slices for performing operations on received operand data (e.g., vector processing, matrix manipulation), and/or the like. Functional units of the deterministic processor are configured to stream operand data across a first (e.g., temporal) dimension in a direction indicated in a corresponding instruction, and receive instructions across a second (e.g., spatial) dimension. The compiler for the deterministic processor is aware of the hardware configuration of the processor, and configures the timing of data and instruction flows such that corresponding data and instructions are intersected at each computational element at a predetermined time. Each functional slice of the deterministic processor may operate on a set of data lanes in a Single Instruction Multiple Data (SIMD) manner. The set of data lanes can be referred to herein as a "superlane" and represents a cross-section of all the functional slices on a processor chip.

Embodiments of the present disclosure are directed to an integrated circuit. The integrated circuit includes a first die and a second die connected to the first die forming a tile structure. The first die is shifted relative to the second die by a first shift amount along a first dimension and by a second shift amount along a second dimension orthogonal to the first dimension. The tile structure is configured to operate as a single core processor for model-parallelism across the first die and the second die of the tile structure.

Embodiments of the present disclosure are further directed to an integrated circuit that comprises an array of tile structures. Each tile structure in the array includes a first die, and a second die connected to the first die in a face-to-face (F2F) configuration. The first die is shifted relative to the second die by a first shift amount along a first dimension and by a second shift amount along a second dimension orthogonal to the first dimension forming an offset alignment between the first die and the second die. The array of tile structures is configured to operate as a single core processor for model-parallelism across the tile structures.

Embodiments of the present disclosure are further directed to an integrated circuit comprising stacked tile structures. The integrated circuit includes a first plurality of tile structures coupled to a first side of a tile-to-tile (T2T) bridge, and a second plurality of tile structures coupled to a second side of the T2T bridge opposite the first side. Each tile structure in the first and second pluralities includes a first die and a second die connected in a F2F configuration. The first die is shifted relative to the second die by a first shift amount along a first dimension and by a second shift amount along a second dimension orthogonal to the first dimension. The integrated circuit further includes a first stack of high bandwidth memories (HBMs) coupled to the first side, a second stack of HBMs coupled to the second side, and a heat sink coupled to outer surfaces of the first plurality of tile structures and the first stack of HBMs. In some embodiments, the integrated circuit includes a cuboid structure of tile structures. The tile structures of the cuboid structure are configured to operate as a single core processor for model-parallelism across the tile structures.

Embodiments of the present disclosure further relate to a process (or method) of computing using one or more deterministic streaming processors (e.g., one or more tensor streaming processors) of an integrated circuit. The process includes: initiating issuance of instructions for execution by processing units (e.g., computational elements of one or more functional slices) across a plurality of dies of one or more tile structures of the integrated circuit, initiating streaming of data through the processing units across the plurality of dies of the one or more tile structures for execution of the instructions, and returning of resulting data to one or more memory slices of the one or more tile structures.

Embodiments of the present disclosure further relate to a non-transitory computer-readable storage medium comprising stored thereon computer executable instructions, which when executed by a compiler operating on at least one computer processor cause the at least one computer processor to: initiate issuance of instructions for execution by processing units (e.g., computational elements of one or more functional slices) across a plurality of dies of one or more tile structures of the integrated circuit, initiate streaming of data through the processing units across the plurality of dies of the one or more tile structures for execution of the instructions, and initiate returning of resulting data to one or more memory slices of the one or more tile structures.

BRIEF DESCRIPTION OF THE DRAWINGS

FIG. 2A illustrates an example tile structure, in accordance with some embodiments.

FIG. 2C illustrates an example tile structure with a tile-to-tile (T2T) bridge, in accordance with some embodiments.

FIG. 2D illustrates an example tile structure with a high bandwidth memory (HBM), in accordance with some embodiments.

FIG. 6B illustrates an example integrated circuit with multiple dies mutually connected using the configuration of the tile structure in FIG. 6A, in accordance with some embodiments.

FIG. 7A illustrates an example top view and bottom view of an integrated circuit comprising multiple tile structures mutually connected via a T2T bridge, in accordance with some embodiments.

FIG. 9 illustrates an example integrated circuit implemented as a cuboid structure of tile structures, in accordance with some embodiments.

FIG. 10 is a flowchart illustrating a method of using an integrated circuit for data processing with model-parallelism across a plurality of dies of one or more tile structures, in accordance with some embodiments.

Figure 1A:
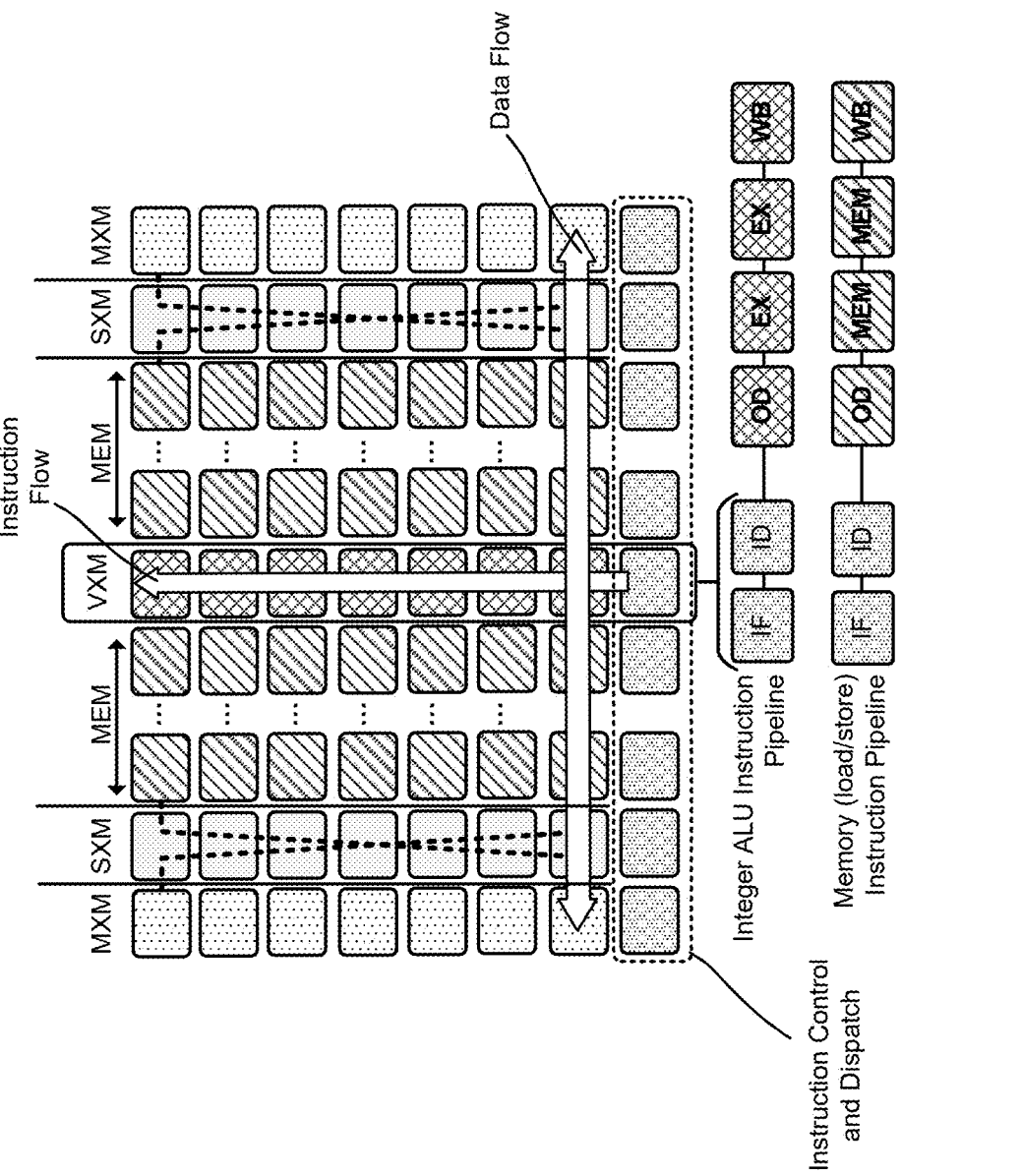
FIG. 1A illustrates an arrangement of functional slices in a tensor streaming processor (TSP), in accordance with some embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Introductory Overview

Disclosed are configurations that include an integrated circuit with one or more deterministic processors (e.g., tensor streaming processors (TSPs) or artificial intelligence processors). Each may have a functional slice architecture. In some embodiments, each deterministic processor is configured to process a machine learning model. Each deterministic processor is divided into a plurality of functional units. The functional units are organized into a plurality of functional slices. Each functional slice is configured to perform specific functions within the deterministic processor. The deterministic processor may include memory functional slices (MEMs) for storing operand data, arithmetic functional slices for performing operations on received operand data (e.g., vector processing, matrix manipulation), and/or the like. Functional units of the deterministic processor are configured to stream operand data across a first (e.g., temporal) dimension in a direction indicated in a corresponding instruction, and receive instructions across a second (e.g., spatial) dimension. The compiler for the deterministic processor is aware of the hardware configuration of the processor, and configures the timing of data and instruction flows such that corresponding data and instructions are intersected at each computational element at a predetermined time. Each functional slice of the deterministic processor may operate on a set of data lanes in a Single Instruction Multiple Data (SIMD) manner. The set of data lanes can be referred to herein as a "superlane" and represents a cross-section of all the functional slices on a processor chip.

The disclosed embodiments are directed to a deterministic streaming processor having a functional slicing architecture. In some embodiments, the deterministic streaming processor may comprise a tensor streaming processor (TSP) having a functional slicing architecture, which may be used for hardware-accelerated machine learning (ML) applications.

The deterministic streaming processor (e.g., TSP) comprises a plurality of "computational elements," each computational element corresponding to a functional unit within the processor. The on-chip memory and network-on-chip (NoC) of the processor architecture are fused to provide both storage of operands and results, and may act as a conduit for transferring operand and/or result data to/from the functional units of the processor. The computational elements of the deterministic streaming processor are divided between different functionalities (e.g., memory, arithmetic operation, etc.), and are organized as functional slices which operate on multi-dimensional data (e.g., tensors). For example, each functional slice is composed from computational elements which border (or abut) each other, both horizontal and vertically, to form the functional slice. The number of computational elements and computation granularity of each computational element may be selected to take advantage of the underlying technology on which it is built. Taken together, the number of computational elements (N) and the word granularity (M) of a memory (e.g., static random-access memory (SRAM)) yields the vector length (VL) of the machine.

In some embodiments, each functional slice of the deterministic streaming processor functions independently, and receives instructions from an instruction control unit (ICU). The ICU may pass instructions to a first computational element of the functional slice, which are then propagated in a first temporal dimension of the processor along the functional slice to the remaining computational elements of the functional slice. On the other hand, data operands for storage and/or processing may be passed between different functional slices of the deterministic streaming processor, in a second spatial dimension of the processor perpendicular to the first temporal dimension. As such, the data flow and the instruction flow of the deterministic streaming processor are separate flows.

In some embodiments, a compiler for the deterministic streaming processor is aware of the hardware configuration of the deterministic streaming processor, and synchronizes the timing of data and instruction flows such that corresponding data and instructions are received at each computational element with a predetermined temporal relationship (e.g., during the same clock cycle, separated by a predetermined delay, etc.). In some embodiments, the predetermined temporal relationship may be based upon the hardware of the deterministic streaming processor, a type of instruction, and/or the like. Because the temporal relationship between data and instructions are known by the compiler, the operand data received by a computational element does not include any metadata indicating what the data is to be used for or where it is to be consumed. Instead, each computational element receives instructions, and based upon the predetermined timing, performs the instruction on the then current data held by a register associated with the computational element. This allows for the data and instructions to flow through the deterministic streaming processor more efficiently.

Embodiments of the present disclosure are directed to an integrated circuit that provides scalable resources and more specifically scalable memory and computational elements. The integrated circuit includes a first die and a second die that is connected to the first die forming a tile structure. The first die is shifted relative to the second die by a first shift amount along a first dimension and by a second shift amount along a second dimension orthogonal to the first dimension. The tile structure is configured to operate as a single core processor for model-parallelism across the first and second dies of the tile structure.

Embodiments of the present disclosure are further directed to an integrated circuit that comprises an array of tile structures. Each tile structure in the array includes a first die, and a second die connected to the first die in a face-to-face (F2F) configuration. The first die is shifted relative to the second die by a first shift amount along a first dimension and by a second shift amount along a second dimension orthogonal to the first dimension forming an offset alignment between the first die and the second die. The array of tile structures is configured to operate as a single core processor for model-parallelism across the tile structures.

Embodiments of the present disclosure are further directed to an integrated circuit comprising stacked tile structures. The integrated circuit includes a first plurality of tile structures coupled to a first side of a tile-to-tile (T2T) bridge, and a second plurality of tile structures coupled to a second side of the T2T bridge opposite the first side. Each tile structure in the first and second pluralities includes a first die and a second die connected in a F2F configuration. The first die is shifted relative to the second die by a first shift amount along a first dimension and by a second shift amount along a second dimension orthogonal to the first dimension. The integrated circuit further includes a first stack of high bandwidth memories (HBMs) coupled to the first side, a second stack of HBMs coupled to the second side, and a heat sink coupled to outer surfaces of the first plurality of tile structures and the first stack of HBMs. The stacked tile structures (e.g., stacked in a cuboid structure) is configurable to operate as a single core processor for model-parallelism across the tile structures.

Architectural Overview of Tensor Streaming Processor

In accordance with embodiments of the present disclosure, the processor plane comprises a TSP, e.g., as may be commercially available from GROQ, INC. of Mountain View, California. It is to be understood that although many embodiments described herein use a TSP as the preferred processors, other deterministic processors may be used in commercial applications. Figure (FIG. 1A shows an arrangement of functional slices in a TSP, in accordance with some embodiments.

Certain core architectural elements set the TSP apart from GPU and accelerators. In a conventional chip multiprocessor (CMP), each "computational element" is an independent core that is interconnected using the on-chip network to exchange data between cores. Instruction execution is carried out over several stages: (i) instruction fetch (IF), (ii) instruction decode (ID), (iii) execution (EX) on Arithmetic Logic Units (ALUs), (iv) memory access (MEM), and (v) writeback (WB) to update the results in the general-purpose registers (GPRs).

In contrast from conventional multicore, where each computational element is a heterogeneous collection of functional units but globally homogeneous, the TSP inverts that to have a local functional homogeneity but chip-wide (global) heterogeneity. More specifically, the TSP reorganizes the homogeneous two-dimensional mesh of cores into the functionally sliced microarchitecture shown in FIG. 1A. In this approach, each computational element implements a specific function and is stacked vertically into a specific "functional slice" in the Y-dimension of the two-dimensional on-chip mesh. The TSP disaggregates the basic elements of the conventional multicore per their respective functions: instruction control and dispatch (e.g., via instruction control unit (ICU)), memory (MEM), integer (INT) arithmetic, float point unit (FPU) arithmetic, and network (NET) interface, as shown by the functional slice labels at the top of FIG. 1A. Each row of the two-dimensional on-chip mesh contains a cross section of all functional slices.

In this organization, each functional slice is independently controlled by a sequence of instructions specific to its on-chip role. For instance, the MEM functional slices support Read and Write but not, necessarily Add or Mul, which are typically performed in arithmetic functional slices (e.g., the vector execution module (VXM) and matrix execution module (MXM) functional slices) for some typical machine learning (ML) algorithms, such as the linear regression algorithm.

All functional slice's computational elements execute the same instruction stream-Single Instruction Multiple Data (SIMD) instructions. Thus, the common instruction decode and dispatch logic can be factored out into its own computational element (e.g., ICU) and decompose the normal instruction execution pipeline into two areas: (i) instruction fetch, decode, and parceling and (ii) operand read, execute, and writeback. This approach decouples the memory subsystem from the functional units retrieving their operands and depositing results.

In some embodiments, each functional slice implements, e.g., a 20-stage vector pipeline that spans the computational elements of each functional slice, with each computational element producing 16 elements of the 320-element maximum vector length. This organization naturally decomposes instruction flow in the vertical dimension, and data flow in the horizontal dimension as the data flow passes over different function types. With this processor organization, instruction execution is carried out by different computational elements: instruction fetching and decoding in the ICU and operand decode, execution and writeback at each computational element of the functional slice as the (vertical flowing) dispatched instruction intersects with the (horizontal flowing) operand data on which the dispatched instruction is operating. It will be appreciated that reference to 'vertical' and 'horizontal' or 'north', 'south', 'east' and 'west' are used in connection with the illustrations shown in the Figures, are abstractions that are solely intended to aid the reader and should not be inferred as technical limitations.

Figure 1B:
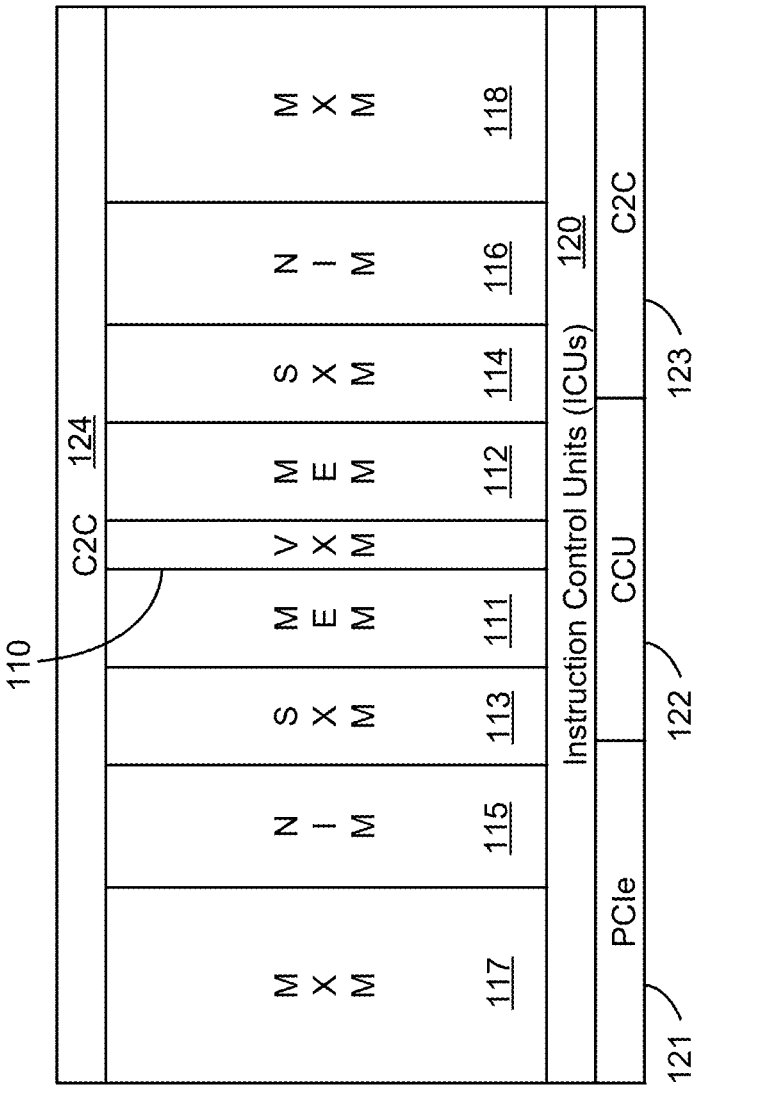
FIG. 1B illustrates an example TSP architecture, in accordance with some embodiments.

FIG. 1B illustrates an example TSP 100, in accordance with some embodiments. The TSP 100 may include memory and arithmetic units optimized for multiplying and adding input data with weight sets (e.g., trained or being trained) for machine learning applications (e.g., training or inference). For example, the TSP 100 includes a VXM 110 for performing operations on vectors (i.e., one-dimensional arrays of values). Other elements of the system are arranged symmetrically on either side of the VXM 110 to optimize processing speed. For example, the VXM 110 is adjacent to MEMs 111-112, SXMs 113-114 to control routing of data, data domain and presentation controllers (or numerical interpretation modules (NIMs)) 115-116, and MXMs 117-118. An ICU 120 controls the flow of data and execution of operations across blocks 110-118, for example. The TSP 100 may further include communications circuits such as chip-to-chip (C2C) circuits 123-124 and an external communication circuit (e.g., PCIe) 121. The TSP 100 may, for example, further include a chip control unit (CCU) 122 to control boot operations, clock resets, and other low level setup operations.

Figure 1C:
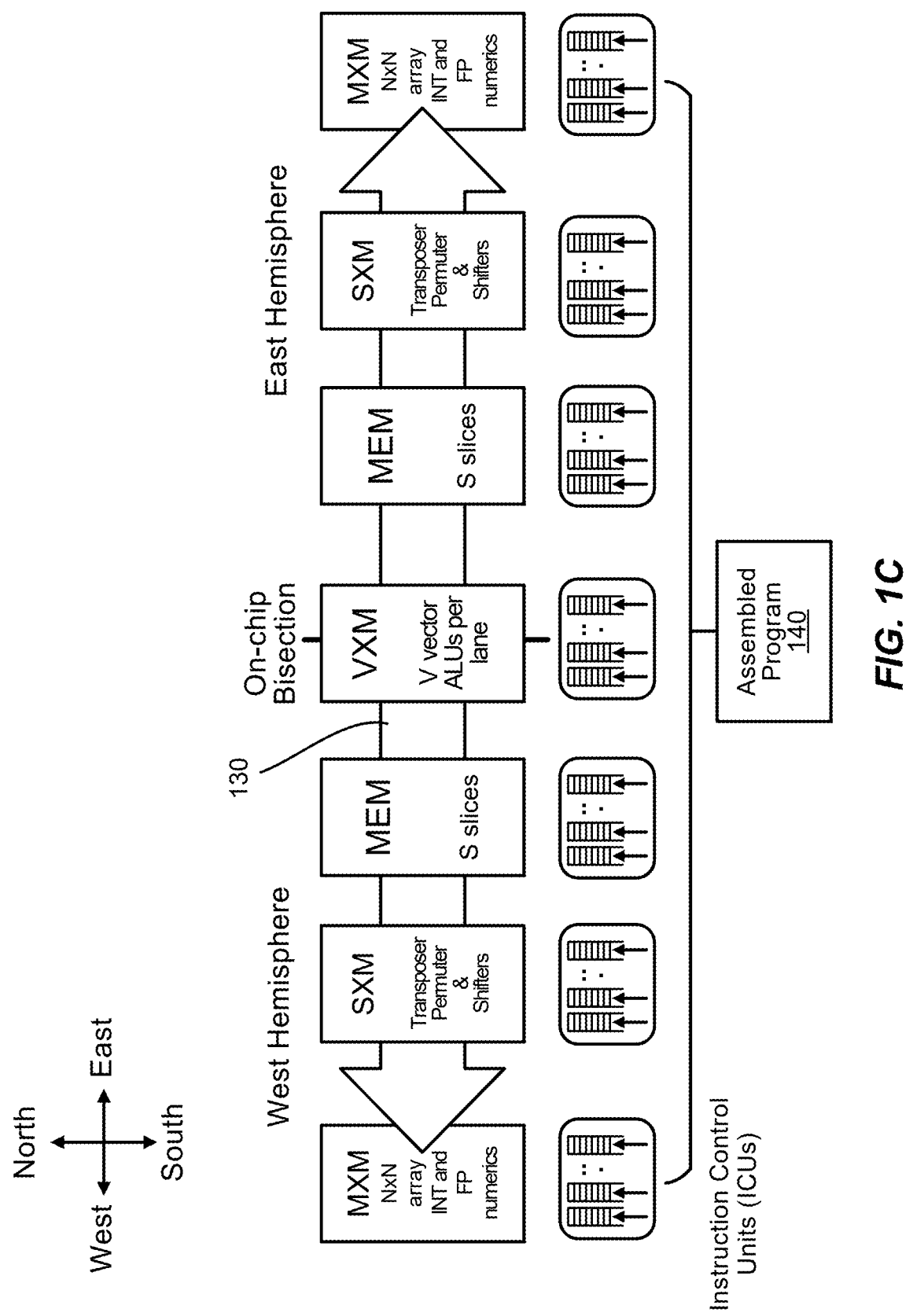
FIG. 1C illustrates organization and data flow within a row of a TSP, in accordance with some embodiments.

FIG. 1C illustrates organization and data flow within a row of the TSP 100, in accordance with some embodiments. As shown in FIG. 1C, each row of the two-dimensional on-chip mesh of the TSP 100 contains a cross section of all functional slices, e.g., N×N array of MXMs (e.g., N=320) configured for both integer (INT) and floating-point (FP) numerics (e.g., INT8 and FP16), S MEM functional slices (S=44), VXM functional slices with V vector ALUs per lane (e.g., V=16), and SXM functional slices. In this organization, each functional slice is independently controlled by a sequence of instructions specific to its on-chip role fetched by a corresponding array of ICUs (e.g., a total of I=144 ICUs). Conceptually, the functional slices are fixed and data 130 are flowing across their computational elements. As the data flows through a specific functional slice, each functional slice can optionally intercept the data operands and compute a result (e.g., in case of MXM and VXM), or move data between data transport lanes on the network (e.g., in case of SXM and MEM). Instructions flow northward from the ICUs to the functional slices, while data (operands and results) primarily flow east and west between functional slices. Any inter-lane data movement within a vector uses the on-chip network functional slice.

It is noted that the "east-west-north-south" directionality is provided herein for ease of discussion and relativity. Furthermore, the "east-west-north-south" directionality is used as a reference for explanation of processing flow as described herein and is not intended to be limited with respect to a label of a particular direction. For example, north-south could be reoriented to east-west and the principles currently described with east-west could apply to the reoriented north-south. In another example of the directionality not intended to be limited to the description per the reference noted, directionality could be referenced such that north-south is up-down and east west is right-left and the principles would accordingly apply.

In one embodiment, 320 lanes are overlaid on the TSP 100 where each computational element in the on-chip mesh operates on, e.g., 16-lanes in a SIMD manner. The 16-lane unit can be referred to herein as a "superlane" and represents a cross-section of all the functional slices on the chip. As such, a superlane may represent the architecture's minimum vector length (minVL) of, e.g., 16 elements. Likewise, the vertical composition of 20 tiles forming a functional slice may produce a maximum vector length (max VL) of, e.g., 20×16=320 functional units. Each of the 144 independent on-chip ICUs can issue one or more instructions per clock cycle. The compiler has explicit control of a program order in each instruction queue, e.g., by generating an assembled program 140 for execution by the ICUs and functional slices. There are 64 logical streams per lane for moving operands or results on-chip with, e.g., 32 streams eastward and 32 streams westward. The 220 MB of globally shared SRAM may deliver 32 bytes per lane of stream bandwidth and low-latency access to model parameters. For example, MEM can read and MXM can install more than e.g., 100,000 weights into a 320×320 array (i.e., 320 lanes×320 functional units) in less than 30 clock cycles including SRAM and on-chip network transit delays.

As shown in FIG. 1B and FIG. 1C, the on-chip network is implemented as X-dim mesh and Y-dim mesh of computational elements with X-Y-X dimension order routing. Each instruction specifies the first hop direction (east or west), so memory instruction semantics have both an address and a dataflow direction (see FIG. 1C). Streams are routed in the X-dimension through MEM 111/112 and routed in the Y-dimension using the SXM's 113/114 permuter and lane-shifters to move data elements vertically. The SXM's 113/114 permuter implements a permutation function that is a mathematical technique that determines the number of possible arrangements in a set when the order of the arrangements matters. Common mathematical problems involve choosing only several items from a set of items with a certain order.

The MEM 111/112 and the SXM 113/114 provide deterministic routing of stream data as the stream data flows in the X and Y dimensions, respectively. With the TSP architecture 100, functional slices interact with streams of data in a producer-consumer fashion. That is, the functional slices consume operands from streams and produce results onto a (possibly different) stream, like an assembly line operator (functional slice) and conveyor belt (stream).

Conceptually, the functional slices are fixed and data is flowing across computational elements as shown in FIG. 1C. As the data flows through the functional slice, each computational element can optionally intercept the data operands and compute a result (if the computational element comprises an arithmetic logic unit (ALU)) or move data between lanes on the network if the computational element comprises a switching element.

Streams provide a programming abstraction and are a conduit through which data flows between functional slices. Unlike GPRs, the functional slices operate on streams of parallel data flowing east or west (horizontally) across the chip. The horizontally flowing streams carrying operands intercept the vertically (northward) flowing instructions (see FIG. 1C) to perform a computation at a computational element on a functional slice. A compiler accurately maintains the chip's architectural state and uses that knowledge to ensure that instructions correctly intercept its stream operand(s).

Streams are implemented in hardware by a chip-wide streaming register file. Streams are architecturally visible and transport operands and results between functional slices. A common software pattern involves reading operand data from one or more MEM functional slices that is then subsequently consumed and operated on by a downstream arithmetic functional slice. The results of the operation are then produced onto another stream such that they can be written back to memory or passed to subsequent computational elements. For example, a Z=X+Y operation might require four instructions: Read S1, X and Read S2, Y are executed on two MEM functional slices and directed inward toward an ALU functional slice to perform the Add S1, S2, S3. Lastly, the result is stored back to memory via a Write S3, Z. The streams represent a collection of N-elements, operated upon in a SIMD manner by each functional slice.

By way of example, a TSP architecture makes several deliberate tradeoffs on the hardware-software interface, pushing the complexities associated with scheduling into the compiler. Specifically, it falls on the compiler to precisely schedule instructions to use the hardware correctly and efficiently. At times this may involve selecting one of several means by which an algorithm or meta-operation may be realized on the hardware. Removing the control complexity of dynamic instruction scheduling for multi-issue execution units allows the ICU to be relatively small, accounting for, e.g., less than 3% of the chip area.

The compiler has access to, e.g., 320-lane programming abstraction overlaid on a TSP architecture where each computational element in the on-chip mesh operates on 16-lanes in a SIMD manner. The 16-lane unit can be referred to as a "superlane" which is a cross-section of all the functional slices on the chip and the minimum granularity of computation. As such, a superlane represents the architecture's minimum vector length, minVL, of 16 elements. Likewise, the vertical composition of 20 tiles to form a functional slice produces a maximum vector length, max VL, of 20×16=320 elements.

The compiler has access to, e.g., 144 independent instruction queues (i.e., ICUs) on-chip: (a) six for westward MXM including two independent two-dimensional MAC (multiply-accumulate) arrays; (b) 14 for westward SXM for intra-superlane and inter-lane switching by rearranging elements of vectors; (c) 44 for westward MEM including 44 parallel functional slices of static random-access memory (SRAM); (d) 16 for VXM including 16 vector ALUs per lane; (e) 44 for eastward MEM-including 44 parallel functional slices of SRAM; (f) 14 for eastward SXM; and (g) six for eastward MXM including two independent two-dimensional MAC arrays, whereas each instruction queue can issue one or more instructions per cycle and the compiler has explicit control of the program order in each instruction queue.

The compiler has access to, e.g., 64 logical streams per lane. For example, 32 logical streams are required to operate on 16 minVL per lane for moving operands or results on-chip with 32 streams eastward, and 32 streams westward.

The compiler has access to, e.g., 220 MBytes of globally shared SRAM, in one embodiment, that delivers 32 bytes per lane of stream bandwidth and low-latency access to model parameters. For example, MEM can read and MXM can install 400K weights into all four 320×320 arrays in less than 40 operational cycles including SRAM and on-chip network transit delay.

Streams are designated by both an identifier (0, . . . , 31) and direction. For example, in (28) designates stream 28 inward, and out (24) designates stream 24 toward the outward edge of the chip. The direction of a stream may be designated as inward (toward the chip bisection) or outward (toward the outward edge of the chip), or the direction may be designated as eastward or westward, as shown in FIG. 1C.

The components of a superlane are organized spatially as shown in FIG. 1C. The TSP's instruction set architecture (ISA) defines instructions spanning different functional areas. The partitioned global address space (PGAS) presented by the MEM functional slices provides memory semantics for vectors to be addressed from SRAM and loaded into an architecturally visible stream with a direction of dataflow toward the functional slice intending to operate on them.

The first functional area (i.e., ICU) provides explicit instruction fetching with IFetch instruction(s), and inter-slice synchronization using Sync and Notify instructions to perform chip-wide barrier synchronization among participating functional slices. A repeated-NOP (no-op) instruction allows for precise cycle-by-cycle control of inter-instruction delay. For example, the compiler has cycle-accurate control when scheduling two operations A and B using an intervening NOP so that N cycles separate them, e.g., OpA NOP(N) OpB.

The second functional area (i.e., VXM) consists of a 4×4 mesh of ALUs in each lane for pointwise arithmetic operations.

The third functional area (i.e., MXM) consists of four independent two-dimensional MAC arrays that operate on, e.g., INT8, FP16 or FP32 data types.

On-chip data movement uses the fourth functional area (i.e., SXM) for intra-superlane and inter-lane switching by rearranging elements of vectors. The SXM is analogous to the NET interface to communicate between cores in FIG. 1A. Together the MEM and SXM work in tandem to form the X-Y dimensional movement of data across the on-chip network.

The fifth functional area (i.e., the east and west hemisphere of on-chip MEM module) is composed of 44 parallel MEM functional slices of SRAM and provides the memory access concurrency necessary to fully utilize the 32 streams in each East or West direction. Each functional slice provides 13-bits of physical addressing of 16-byte memory words, each byte maps to a lane, for a total of 220 MBytes of on-chip SRAM.

An additional sixth functional area includes C2C modules configured to provide Send and Receive primitives for exchanging 320-byte vectors between a pair of TSP chips. One possible TSP implementation has, e.g., a total of 16×4 links operating at 30 Gbps each for a total off-chip bandwidth of 16×4×30 Gbps×2 directions=3.84 Tb/s (Tera-bytes per second) of off-chip pin bandwidth that can be flexibly partitioned to support high-radix interconnection networks of TSPs for large-scale systems. The host interface for peripheral component interconnect express (PCIe) Gen4 may be also handled in this module. The host interface provides a lightweight direct memory access (DMA) engine to emplace a model onto the TSP memory and provides an entry point for bootstrapping the model execution. The host interface also provides a general mechanism for passing interrupts to the host, which may be necessary in the event a multi-bit memory error is observed, for example.

Table I provides a summary of example instructions for each functional slice, in accordance with some embodiments.

TABLE I

SUMMARY OF INSTRUCTIONS FOR EACH FUNCTIONAL SLICE.

| | Instruction | Description |
|---|---|---|
| ICU | NOP N | No-operation, can be repeated N times to delay by N cycles |
| | Ifetch | Fetch instructions from streams or local memory |
| | Sync | Parks at the head of the instruction dispatch queue to await barrier notification |
| | Notify | Releases the pending barrier operations causing instruction flow to resume |
| | Config | Configure low-power mode |
| | Repeat n, d | Repeat the previous instruction n times, with d cycles between iterations |
| MEM | Read a, s | Load vector at address a onto stream s |
| | Write a, s | Store stream s register contents into main memory address a |
| | Gather s, map | Indirectly read addresses pointed to by map putting onto stream s |
| | Scatter s, map | Indirectly store stream s into address in the map stream |
| VXM | unary operation | z = op x pointwise operation on 1 operand, x, producing 1 result, z (e.g., mask, negate) |
| | binary operation | z = x op y pointwise operations with 2 operands x and y producing 1 result, z (e.g., add, mul, sub) |
| | type conversions | Converting fixed point to floating point, and vice versa |
| | ReLU | Rectified linear unit activation function max(0,x) |
| | TanH | Hyperbolic tangent – activation function |
| | Exp | Exponentiation $e^x$ |
| | RSqrt | Reciprocal square root |
| MXM | LW | Load weights (LW) from streams to weight buffer |
| | IW | Install weights (IW) from streams or LW buffer into the 320 × 320 array |
| | ABC | Activation buffer control (ABC) to initiate and coordinate arriving activations |
| | ACC | Accumulate (ACC) either INT32 or FP32 result from MXM |
| SXM | Shift up/ down N | Lane-shift streams up/down by N lanes, and Select between North/South shifted vectors |
| | Permute map | Bijective permute 320 inputs $\rightarrow^{map}$ outputs |
| | Distribute map | Rearrange or replicate data within a superlane (16 lanes) |
| | Rotate stream | Rotate n × n input data to generate $n^2$ output streams with all possible rotations (n = 3 or n = 4) |
| | Transpose sg16 | Transpose 16 × 16 elements producing 16 output streams with rows and columns interchanged |
| C2C | Deskew | Manage skew across plesiochronous links |
| | Send | Send a 320-byte vector |
| | Receive | Receive a 320-byte vector, emplacing it in main memory |

A sequence of instructions performed on different functional slices can be chained to create more complex actions without the need to write back intermediate results to memory. This allows efficient processing of streams at full bandwidth and lowest latency.

Machine learning algorithms typically operate on vectors with coefficients of a specified data type (e.g., INT8, FP16, etc.). These vectors may be interpreted as an abstraction over the underlying data, whose elements can be processed by the same operation in a SIMD manner. The TSP operates on vectors, sometimes organized into rank-2 tensors, and relies on the graph-lowering compiler to transform higher rank tensors into rank-2 tensors.

The TSP's programming model is a producer-consumer model where each functional slice acts as a consumer and a producer of one or more streams. When a vector is read from a main memory, the vector is given a stream identifier (0, . . . , 31) and direction: eastward, or westward. Once the vector is read into a stream register it is a stream and is "flowing" in the given direction in the following sense: given spatially adjacent functional slices at coordinates $x_0$, $x_1$, $x_2$ (where the spatial coordinate increases in the direction of flow), then at a given time $t_i$, the vector representing stream $s_1$ at functional slice $x_1$ can be accessed as operands by that functional slice. Similarly, the functional slices at $x_0$ and $x_2$ will have access to different stream values for the same stream register. In the following cycle $t_{i+1}$, the value $s_1$ either propagates to the functional slice at $x_2$, or else the value $s_1$ is overwritten with a result $r_1$ produced by the functional slice at $x_1$ at cycle t. Similarly, the stream value $s_0$ that was present to be consumed by the functional slice at coordinate $x_0$ at time $t_i$ will be (absent $x_0$ overwriting the value at time $t_i$) available in the next cycle $t_{i+1}$ to the functional slice at $x_1$. Stream operands are steered toward the functional slice that is consuming them and producing a result stream. Streams are constantly flowing across the chip, serving as how functional slices communicate with one another.

In the TSP programming model, an instruction is issued on a functional slice at a given compiler-scheduled time t and executes as a SIMD operation on stream-supplied operand vectors (e.g., of up to 320-elements), producing vectors of the same length on result streams. For example, at the micro-architectural level, the 320-element SIMD instruction is pipelined across the vertical stack of computational elements in the functional slice. That is, at the scheduled time t, the instruction would be issued to the bottom-most computational element of the functional slice, e.g., corresponding to the first 16-element superlane of operand/result vectors. In the subsequent operational cycle, the instruction would be propagated to the next computational element northward in the functional slice, which in turn executes the instruction on the next 16-element super lane of operand vectors. This process continues cycle-by-cycle until the process has traversed, e.g., all 20 computational elements in the functional slice. The combination of vertical instruction pipelining described above, along with the need for operands and instructions to coincide at a precise time, results in a spatial "stagger" of SIMD operand and result data.

Tile Structures for Multiple Die Processors

Embodiments of the present disclosure relate to tile structures for implementation of multiple die devices. In a preferred embodiment, the multiple die devices include at least one TSP device. In an embodiment, a tile structure may include a first array of processing units on a first die that is connected in a face-to-face (F2F) configuration with a second die having a second array of processing units. The tile structure may further include specific interfaces that allow connection with one or more other tile structures (i.e., other die) for implementing various multiple die devices having either multiple processors or, in some embodiments, a multiple-die single processor such as the TSP commercially available from GROQ, INC. The tile structure presented herein allows for efficient coupling of multiple tiles without utilizing any interposer based interface, e.g., silicon-based interposer. In some other embodiments, a tile structure presented herein comprises a pair of artificial intelligence (AI) processors connected in the F2F configuration, a Face-to-Back (F2B) configuration or a Back-to-Back (B2B) configuration.

FIG. 2A illustrates an example tile structure 200, in accordance with some embodiments. The tile structure 200 includes a die 202 and a die 204 connected to the die 202 forming the tile structure 200. As shown in FIG. 2A, the dies 202, 204 in the tile structure 200 are positioned in a stacked, offset configuration. The die 204 is a bottom die having a bottom extension that extends outwardly from under the tile structure 200 and can be referred to as a "shelf", whereas the die 202 is a top die having a top extension that extends outwardly over one edge of the die 202 and can be referred to as a "ledge." The die 202 is connected to the die 204 in a F2F configuration forming the tile structure 200. Details about the F2F configuration forming the tile structure 200 are described below in conjunction with FIG. 3.

The die 202 (i.e., with a portion of the die 202 forming the ledge) may be shifted relative to the die 204 (i.e., with a portion of the die 204 forming the shelf) by a first shift amount along a first dimension (e.g., x dimension or horizontal dimension) and by a second shift amount along a second dimension (e.g., y dimension or vertical dimension) orthogonal to the first dimension. The first shift amount may be equal to or different from the second shift amount. The die 202 may comprise a first TSP having a first plurality of functional units (i.e., functional slices), and the die 204 may comprises one of: a second TSP having a second plurality of functional units (i.e., functional slices), a memory device (e.g., HBM), an interface chip, some other chip, or some combination thereof. In a preferred embodiment, the tile structure 200 forms a single streaming processor (i.e., a single core TSP) with processing units (i.e., functional slices) on each die 202, 204. In other embodiments, the tile structure 200 may comprise a plurality of multiple core devices or other circuits. The tile structure 200 and ledge/shelf configuration shown in FIG. 2A enables additional tile structures to electrically connect to the tile structure 200.

Figure 2B:
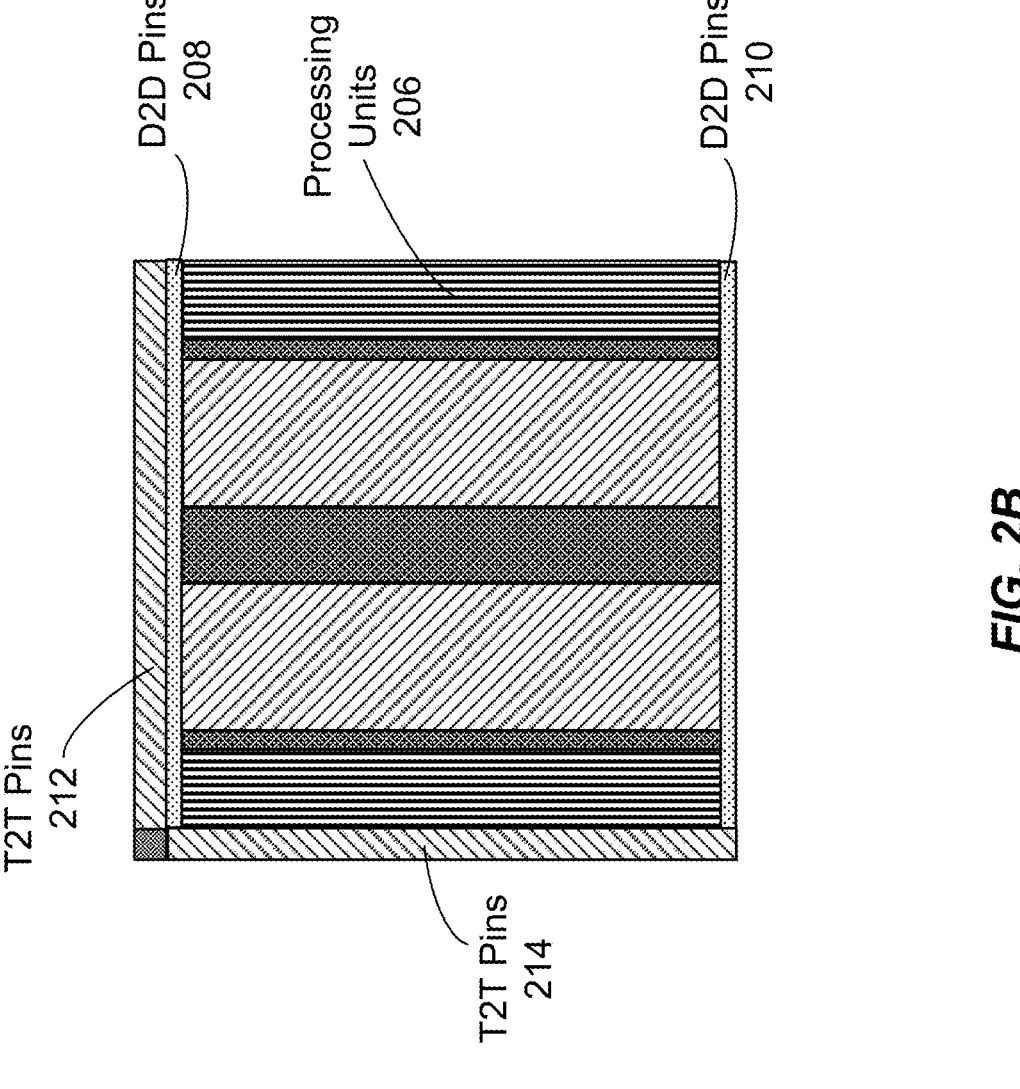
FIG. 2B illustrates an example die of the tile structure in FIG. 2A, in accordance with some embodiments.

FIG. 2B illustrates an example die 202 of the tile structure 200, in accordance with some embodiments. The die 202 may include processing units 206 and interface circuitry, e.g., of a TSP (e.g., the TSP 100). The processing units 206 may comprise a plurality of TSP's functional slices. In one or more embodiments, the die 204 of the tile structure 200 has the same structure as the die 202 and forms a single core TSP with the die 202. In other words, the tile structure 200 may comprise a single core TSP. In one or more other embodiments, the die 204 includes an HBM, an interface chip, some other chip, or some combination thereof.

The interface circuitry of the die 202 may include a first set of die-to-die (D2D) pins 208, a second set of D2D pins 210, a first set of tile-to-tile (T2T) pins 212, and a second set of T2T pins 214. A first D2D interconnect area comprising the first set of D2D pins 208 and a second D2D interconnect area comprising the second set of D2D pins 210 represent interface areas of the die 202 for connection with the die 204 in the F2F configuration (as further shown in FIG. 3.) for forming the tile structure 200. In one or more embodiments, the first and second D2D interconnect areas are coupled to the die 204 via at least a subset of the D2D pins 208, 210 ultrasonically bonded with corresponding connecting circuits (e.g., D2D pins) of the die 204. In one or more other embodiments, the first and second D2D interconnect areas are coupled to the die 204 by forming electrical connections where at least a subset of the D2D pins 208, 210 are placed in physical contact with corresponding connecting circuits (e.g., D2D pins) of the die 204.

A ledge zone of the die 202 (and similarly a shelf zone of the die 204) may include the first and second sets of T2T pins 212, 214 used for connecting the tile structure 200 with one or more other tile structures. Areas around the T2T pins 212, 214 may form the ledge zone (or similarly the shelf zone for the die 204 of the same structure as the die 202) to enable the tile stricture 200 and another tile structure to mutually interconnect forming an electrical connection wherever their corresponding T2T pins align. The T2T pins 212, 214 may be sufficiently spaced away to align with corresponding T2T pins of an adjacent tile structure and any required die-to-die separation (e.g., in the order of 0.1 mm to 0.5 mm). The ledge zone of the die 202 (and similarly the shelf zone of the die 204) is bifurcated into two areas such that one area is along a 'side' edge of the die 202 and the other area is along a 'top' edge of the die 202 (or 'bottom' edge of the die 204). Thus, the tile structure 200 may couple to a pair of tile structures using the two ledge areas of the die 202 to form a closely coupled three-structure device. Similarly, the die 204 of the tile structure 200 may couple to another pair of tile structures using corresponding T2T pins in the shelf areas of the die 204.

FIG. 2C illustrates an example tile structure 220 with a T2T bridge 225, in accordance with some embodiments. The tile structure 220 has the same configuration as the tile structure 200. In one or more embodiments, a ledge and/or shelf die of the tile structure 220 forms a direct T2T connection via the T2T bridge 225 to a shared memory (e.g., HBM) for storage of data passed from an adjacent tile structure. The T2T bridge 225 may be positioned along one side of the tile structure 220, e.g., on an available space on top of the shelf (i.e., bottom die) of the tile structure 220. Alternatively (not shown in FIG. 2C), the T2T bridge 225 may be positioned along some other side of the tile structure 220 (e.g., along the bottom side of the tile structure 220). The T2T bridge 225 may comprise T2T pins 230 for connection with an adjacent tile structure. The T2T bridge 225 may include connection pads with the T2T pins 230 on one or both sides of the T2T bridge 225 for connection with one or both dies of the adjacent tile structure.

In some embodiments, the T2T bridge 225 is employed for delivering a power from one die of the tile structure 220 for another die of the adjacent tile structure. In such cases, the mirror imaging may be required between the ledge and shelf dies of the tile structure 220, e.g., for implementation of power supply VDD and VSS connections. The T2T pins 230 of the T2T bridge 225 are preferably positioned in a zone proximate to edges of a T2T bridge die. For example, an area along an edge of the T2T bridge die may contain a first subset of the T2T pins 230 and an area along either the top or the bottom of the T2T bridge die may contain a second subset of the T2T pins 230. The T2T pins 230 when connected to pins of another tile structure or die may form an electrical connection that enable high speed data transmission because of the low ohmic connection formed thereby.

In one or more embodiments, as further shown in FIG. 2C, at least one input-output (IO) die 235 is placed along one or more sides of the tile structure 220 to facilitate connection to one or more external devices such as one or more host computers, one or more sensors (e.g., a camera or other imaging device), a memory device (e.g., HBM structure), or some other external device. The IO die 235 may include an interconnect pin zone where interconnect pins 240 are placed to mate with corresponding T2T pins of the tile structure 220 (not shown in FIG. 2C). In some instances, the IO die 235 may not be able to directly couple to pins located in a shelf or ledge of the tile structure 220 because of constraints imposed by the external devices. In such circumstances, a T2T bridge may be used to couple the IO die 235 to the tile structure 220.

It should be noted that closely positioning dies of adjacent tile structures may provide improved thermal conductivity for removal of heat from top (and/or bottom) sides of the connected tile structures. The F2F tile configuration presented herein represents a preferred approach to ensure virtually no gap between dies of adjacent tile structures. Having good and uniform thermal conduction facilitates efficient cooling and removal of heat using, e.g., a cooling system at the top side of the tile structure. More details about the cooling of the tile structures is provided below in conjunction with FIG. 8B.

FIG. 2D illustrates an example tile structure 250 coupled with a memory device 270, in accordance with some embodiments. The tile structure 250 may include a die 255 (e.g., top die or ledge) and a die 260 (e.g., bottom die or shelf). The tile structure 250 may be an embodiment of the tile structure 200, i.e., the die 255 may be connected to the die 260 in the F2F configuration.

In some embodiments, at least a subset of T2T pins of the die 255 (and/or the die 260) includes one or more through-silicon via (TSV) connectors 265. The TSV connectors 265 allow the tile structure 250 to be connected vertically (e.g., along z dimension) with another tile structure in a F2F configuration, F2B configuration or B2B configuration (e.g., in addition to horizontal connections shown in FIG. 4). In one or more embodiments, the other tile structure coupled to the tile structure (in F2F configuration, F2B configuration or B2B configuration) may include a TSP, a memory device (e.g., HBM device), an interface device, some other device, or combination thereof.

In some embodiments, as shown in FIG. 2D, a memory device 270 (e.g., HBM device) is placed on top of the tile structure 250 and connected to the die 255 via the TSV connectors 265. In other embodiments (not shown in FIG. 2D), a bridge die may provide a connection from pins positioned on either the die 255 or the die 260 of the tile structure 250 to either an adjacent tile structure or to another device (e.g., HBM device) stacked on top of the tile structure. More details about stacking tile structures and HBM devices in an integrated circuit using a bridge die are described below in conjunction with FIGS. 7A-7B and FIGS. 8A-8B.

Figure 3:
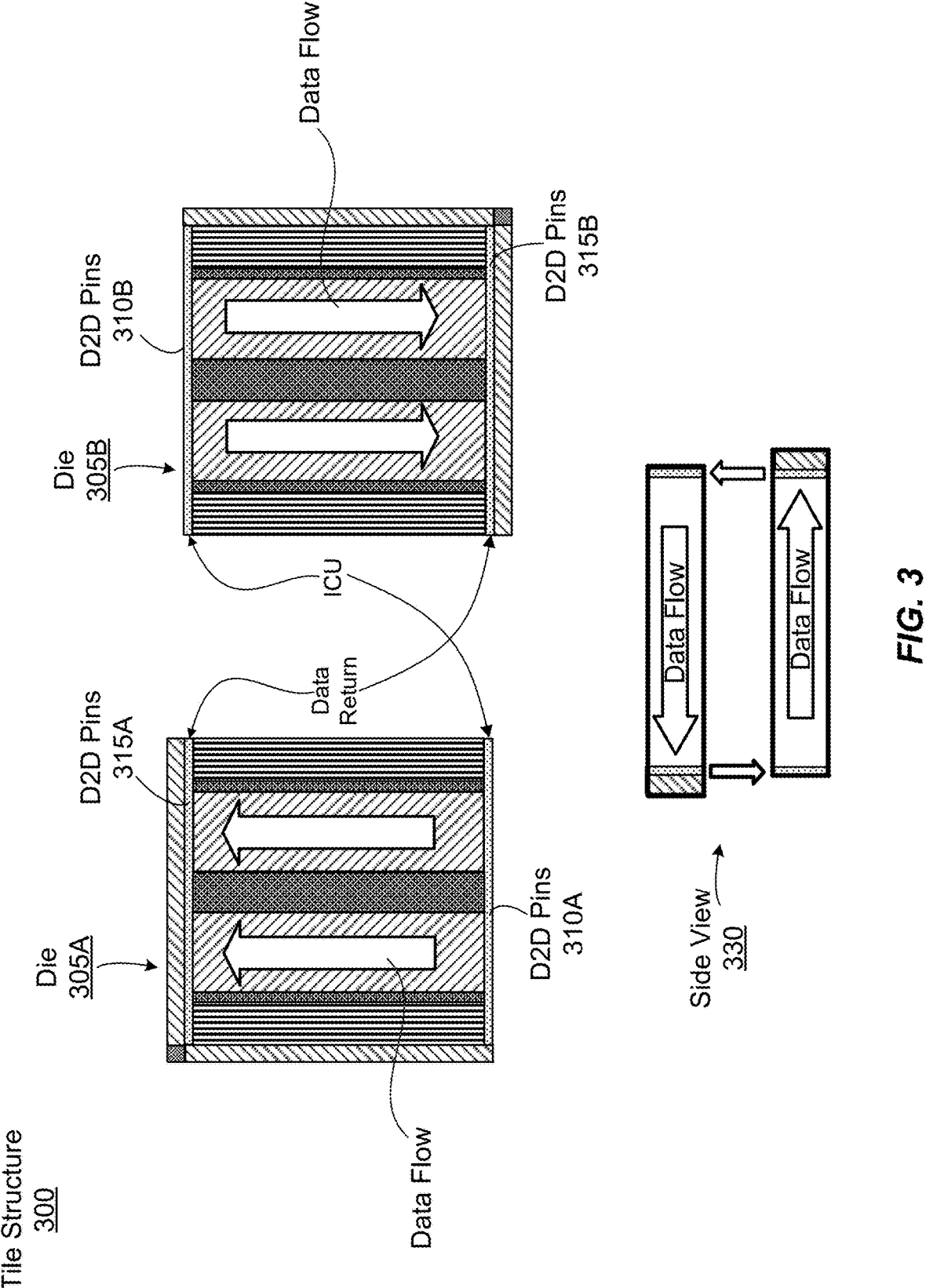
FIG. 3 illustrates an example data flow within a tile structure, in accordance with some embodiments.

FIG. 3 illustrates an example data flow within a tile structure 300, in accordance with some embodiments. The tile structure 300 may be an embodiment of the tile structure 200. The tile structure 300 includes a pair of dies 305A, 305B connected in the F2F configuration. An Instruction Control Unit (ICU) integrated in each die 305A, 305B (e.g., as part of corresponding D2D pins 310A, 310B, as shown in FIG. 3) may issue instructions for execution by one or more processing units (e.g., computational elements of one or more functional slices) in each die 305A, 305B. Upon issuance of the instructions by the ICU, data flow is initiated through processing units in each die 305A, 305B, and resulting data are returned to corresponding D2D pins 315A, 315B of each die 305A, 305B of the tile structure 300 (shown as "Data Return" in FIG. 3). As shown by a side view 330 of the tile structure 300, the resulting data may be passed from one die to another within the tile structure 300 via D2D pins 310A, 310B, thus providing high speed data communication between the pair of dies 305A, 305B of the tile structure 300.

Figure 4:
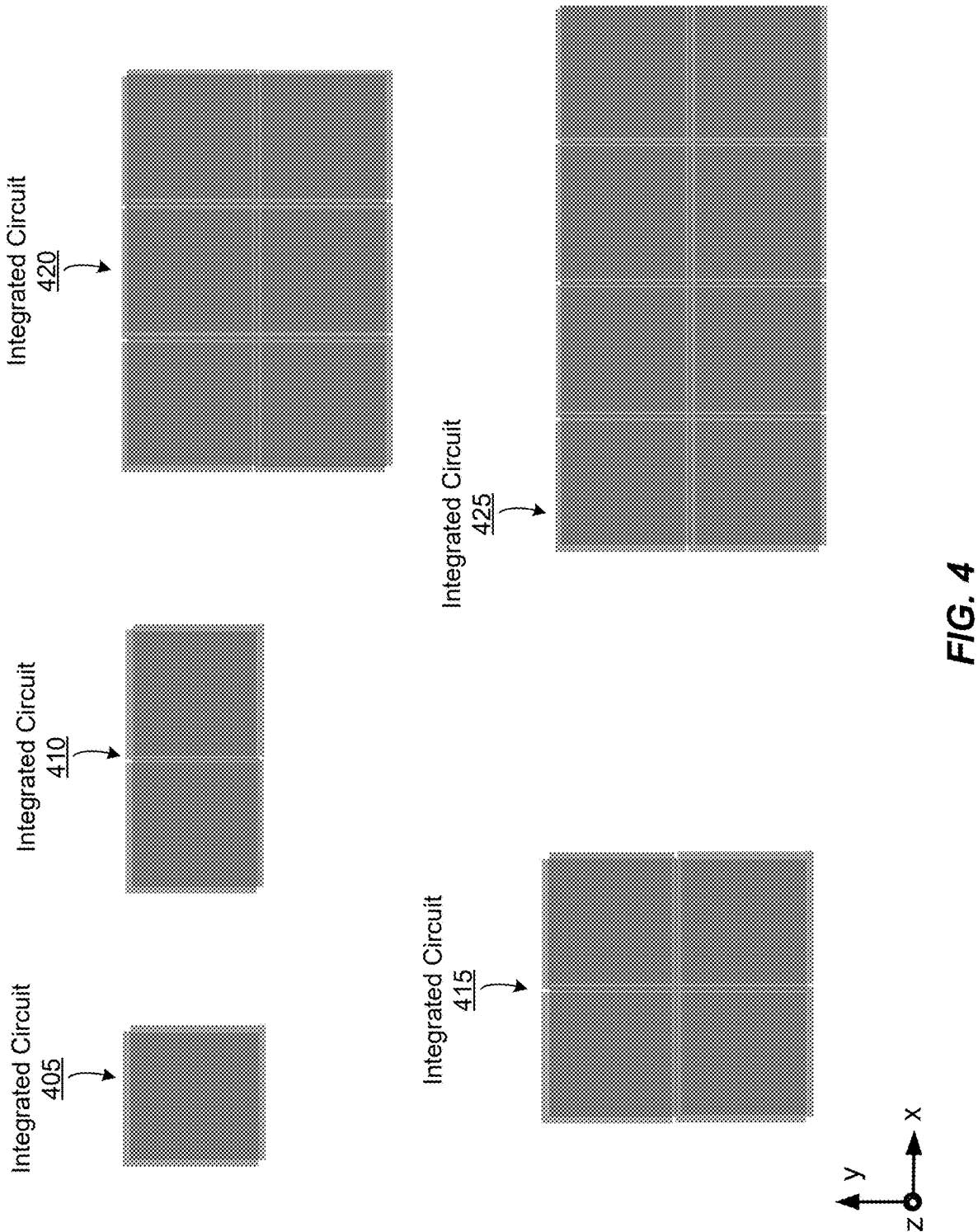
FIG. 4 illustrates examples of two-dimensional arrays of tile structures for implementation of various multiple die processor architectures, in accordance with some embodiments.

FIG. 4 illustrates examples of two-dimensional arrays of tile structures for implementation of various multiple die processor architectures, in accordance with some embodiments. In integrated circuit 405 represents, in one embodiment, a deterministic streaming processor composed of a pair of dies connected in the F2F configuration forming a tile structure (e.g., an embodiment of the tile structure 200). By connecting horizontally two or more tile structures, various multiple die processors can be implemented.

As shown in FIG. 4, an integrated circuit 410 includes a pair of tile structures connected horizontally in an 1×2 array of tile structures. In this case, a top die of a first tile structure may be connected (e.g., via corresponding T2T pins) to a bottom die of a second tile structure, and a bottom die of the first tile structure is connected (e.g., via corresponding T2T pins) to a top die of the second tile structure. This is made possible by shifting top and bottom dies relative to each other in each tile structure so that the second tile structure can fit into available die areas of the first tile structure. The same process can be repeated multiple times in both x and y dimensions, as further shown in FIG. 4 for implementing other multiple die processors. For example, as shown in FIG. 4, four tile structures can be connected horizontally into a 2×2 array of tile structures forming an integrated circuit 415; six tile structures can be connected horizontally into a 2×3 array of tile structures forming an integrated circuit 420; and eight tile structures can be connected horizontally into a 2×4 array of tile structures forming an integrated circuit 425. Each array of tile structures (i.e., each integrated circuit 405, 410, 415, 420, 425) may be configured to function as a single core processor for model-parallelism across dies of the tile structures.

FIG. 4 is intended to illustrate deterministic streaming processor architectures that are extendable such as for a TSP device. In other embodiments, the deterministic streaming processor architectures may comprise multiple cores, and various other variations for connecting tile structures not shown in FIG. 4 are possible, such as vertical connection of tile structures on top of each other, combination of vertical and horizontal connection of tile structures, etc. In some embodiments, the integrated circuit 405 can be referred to as a "single core" integrated circuit. Similarly, the integrated circuits 410, 415, 420, 425 can be referred to as a "dual core" integrated circuit, "quad-core" integrated circuit, "hexa-core" integrated circuit, and "octa-core" integrated circuit, respectively. It should be noted that the use of term "core" is not limited to one or multiple processor cores. Rather, the use of "core" may simply denote the number of tile structures of the same configuration (e.g., the configuration of tile structure 200) included in a deterministic streaming processor.

Figure 5A:
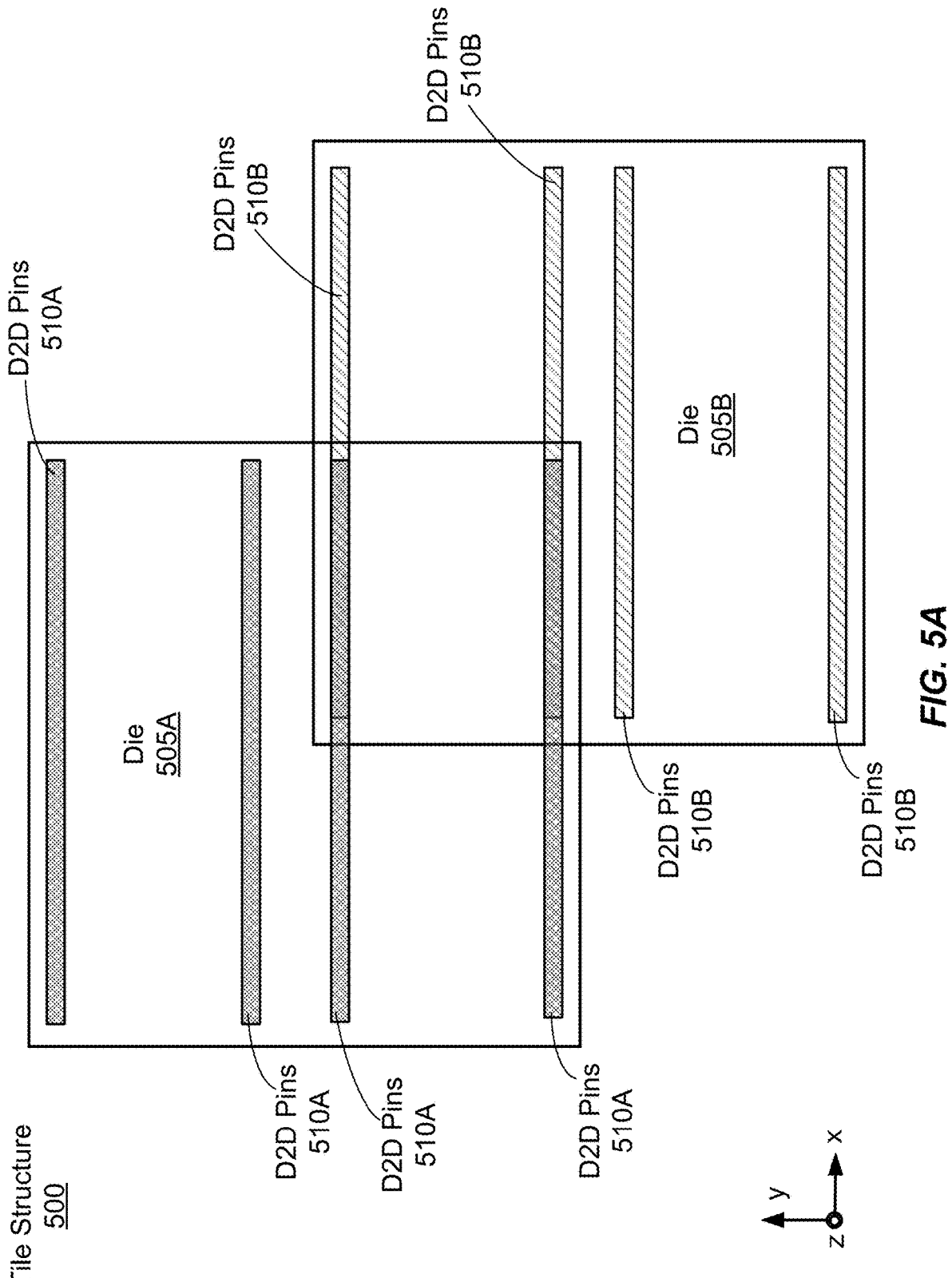
FIG. 5A illustrates an example of a pair of dies connected in a tile structure, in accordance with some embodiments.

FIG. 5A illustrates an example of a pair of dies 505A, 505B connected in a tile structure 500, in accordance with some embodiments. The die 505A may be shifted relative to the die 505B by a first shift amount along a first dimension (e.g., x dimension) and by a second shift amount along a second dimension (e.g., y dimension) orthogonal to the first dimension forming an offset alignment between the die 505A and the die 505B. The tile structure 500 may be configured to operate as a single core processor for model-parallelism across the dies 505A, 505B. The tile structure 500 may be an embodiment of the tile structure 200.

Each die 505A and 505B in the tile structure 500 may include a TSP having an array of computational elements (e.g., as part of functional/memory slices) on a substrate. Alternatively, instead of a TSP, one of the dies 505A, 505B may comprise a memory device (e.g., HBM), an interface device (e.g., a bridge die), or some other device. A plurality of D2D pins 510A, 510B may be positioned on each die 505A, 505B. It can be observed that each die 505A, 505B can be divided into four quadrants, and each quadrant in each die 505A, 505B may include a portion of D2D pins 510A, 510B for a direct high speed connection with a corresponding pair of D2D pins 510A, 510B in the adjacent die. As shown in FIG. 5A, a lower right quadrant of the die 505A is connected with an upper left quadrant of the die

505B, e.g., by positioning portions of the D2D pins 510B of the die 505A on top of corresponding portions of the D2D pins 510A of the die 505A (or vice versa), thus providing high speed data communication between the die 505A and the die 505B.

Figure 5B:
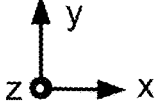
FIG. 5B illustrates an integrated circuit having multiple dies mutually connected using the configuration of the tile structure in FIG. 5A, in accordance with some embodiments.

Direct connection of a pair of dies 505A, 505B illustrated in FIG. 5A can be extended to achieve F2F connections between more than two dies. FIG. 5B illustrates an integrated circuit 520 with multiple dies (e.g., 13 dies) mutually connected using the configuration of the tile structure 500, in accordance with some embodiments. As shown in FIG. 5B, each quadrant of die A may be connected, via corresponding portions of D2D pins (as shown in FIG. 5A), with a corresponding quadrant of die 525(1), die 525(2), die 525(4), and die 525(5). Thus, high speed data communication via the D2D pins may be established between die 530A and each of dies 525(1), 525(2), 525(4) and 525(5). Similarly, each quadrant of die 530B may be connected, via corresponding portions of D2D pins (as shown in FIG. 5A), with a corresponding quadrant of die 525(2), die 525(3), die 525(5) and die 525(6). Thus, high speed data communication via the D2D pins may be established between die 530B and each of dies 525(2), 525(3), 525(5) and 525(6). Further, each quadrant of die 530C may be connected, via corresponding portions of D2D pins (as shown in FIG. 5A), with a corresponding quadrant of die 525(4), die 525(5), die 525(7) and die 525(8). Thus, high speed data communication via the D2D pins is established between die 530C and each of dies 525(4), 525(5), 525(7) and 525(8). Finally, each quadrant of die 530D is connected, via corresponding portions of D2D pins (as shown in FIG. 5A), with a corresponding quadrant of die 525(5), die 525(6), die 525(8) and die 525(9). Thus, high speed data communication via the D2D pins is established between die 530D and each of dies 525(5), 525(6), 525(8) and 525(9). Accordingly, the integrated circuit 520 in FIG. 5B includes an example of 13 dies mutually connected via corresponding D2D pins for high-speed data communication. Each die 530A, 530B, 530C, 530D may be a TSP, a memory device (e.g., HBM device), an interface device (e.g., a bridge die), or some other device. It should be noted that each die 530A, 530B, 530C, 530D when implemented as an interface device (e.g., bridge die) may be used to interface the integrated circuit 520 (e.g., via one or more quadrants of a respective die 530A, 530B, 530C, 530D) to a host computer, an HBM device, or some other device.

Figure 6A:
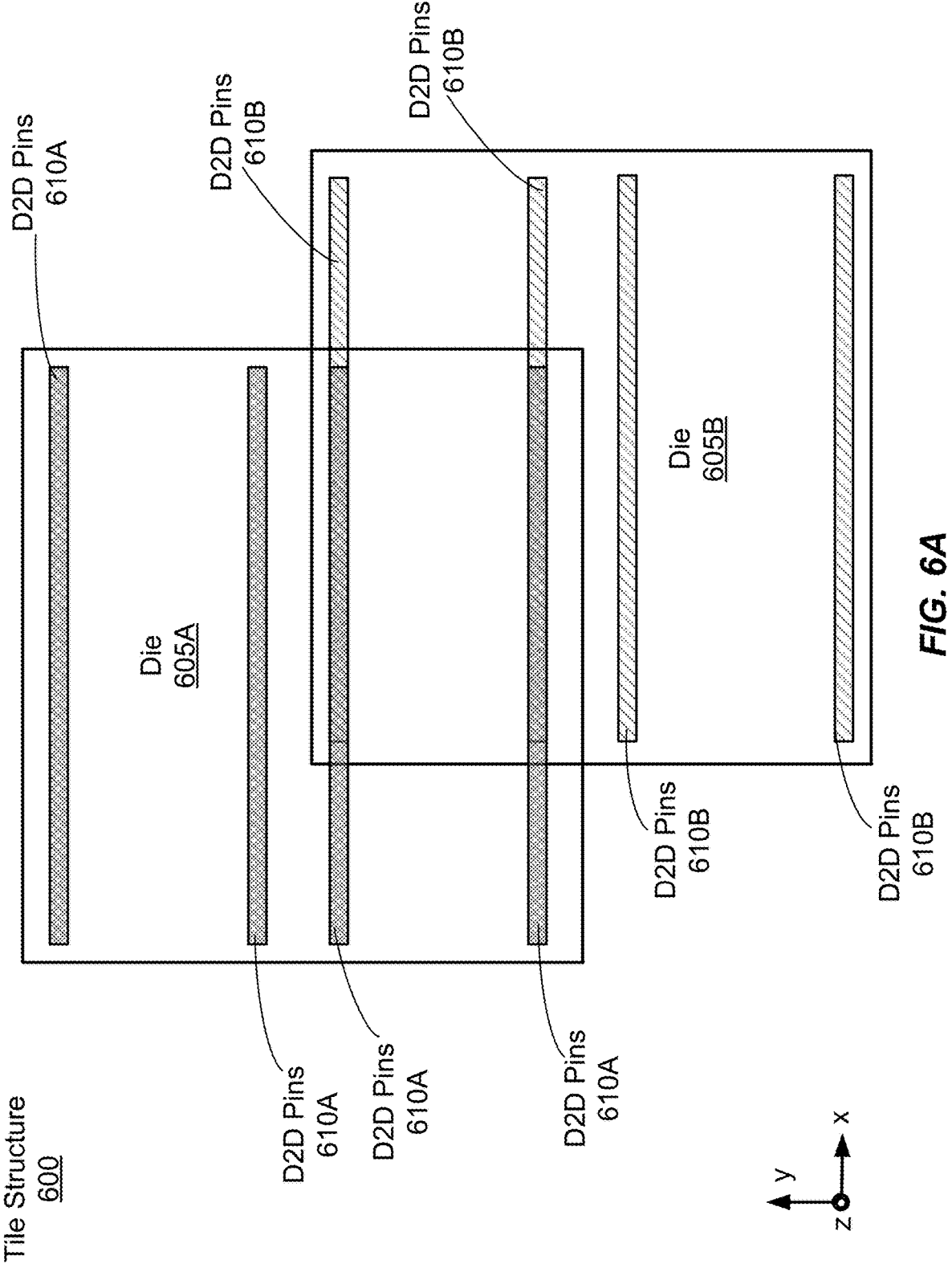
FIG. 6A illustrates another example of a pair of dies connected in a tile structure, in accordance with some embodiments.

FIG. 6A illustrates an example of a pair of dies connected in a tile structure 600, in accordance with some embodiments. The die 605A may be shifted relative to the die 605B by a first shift amount along a first dimension (e.g., x dimension) and by a second shift amount along a second dimension (e.g., y dimension) orthogonal to the first dimension forming an offset alignment between the die 605A and the die 605B. The tile structure 600 may be configured to operate as a single core processor for model-parallelism across the dies 605A, 605B.

Each die 605A and 605B in the tile structure 600 may include a TSP having an array of computational elements (e.g., as part of functional/memory slices) on a substrate. Alternatively, instead of a TSP, one of the dies 605A, 605B may comprise a memory device (e.g., HBM), an interface device (e.g., a bridge die), or some other device. A plurality of D2D pins 610A, 610B may be positioned on each die 605A, 605B. Similarly, as in the case of tile structure 500 in FIG. 5A, direct connection between the die 605A and the die 605B in the tile structure 600 is achieved, e.g., by positioning a portion of the D2D pins 610B of the die 605B in contact with a corresponding portion of the D2D pins 610A of the die 605A (or vice versa).

Referring back to FIG. 5A, it can be observed that each die 505A, 505B in FIG. 5A can be divided into four quadrants of the same size, and each quadrant in each die 505A, 505B exploits a corresponding portion of the D2D pins 510A, 510B of the uniform size for a direct connection with a corresponding portion of 510A, 510B pins in an adjacent die. However, unlike in the tile structure 500 in FIG. 5A, the tile structure 600 in FIG. 6A is formed by connecting a pair of dies via longer portions of the D2D pins 610A, 610B than in the case of tile structure 500. Therefore, as shown in FIG. 6A, a direct connection between the lower right quadrant of the die 605A and the upper left quadrant of the die 610A via the D2D pins 610A, 610B is longer than for the tile structure 500. However, it can be observed from FIG. 6A that remaining portions of D2D pin area in each die 605A, 605B are smaller which means fewer possible connections may be formed, and connection between each die 605A, 605B and a corresponding adjacent die (not shown in FIG. 6A) via these portions of area of the D2D pins 610A, 610B is smaller than for the tile structure 500. Since there are fewer D2D pins in such areas, each pin may be multiplexed so that multiple signals could be routed through each pin connection.

FIG. 6B illustrates an example integrated circuit 620 with multiple dies (e.g., five dies) mutually connected using the configuration of the tile structure 600. As shown in FIG. 6B, die 630 is directly connected via corresponding D2D pins in a corresponding larger area with dies 625(2) and 625(4). As further shown in FIG. 6B, die 630 is directly connected via corresponding D2D pins in a smaller area with dies 625(1) and 625(3). Thus, the integrated circuit 620 may provide direct high speed data communication between die 630 and each of the dies 625(1), 625(2), 625(3) and 625(4). A communication bandwidth between each pair of dies is not uniform, but a communication bandwidth is larger between die 630 and die 625(2) (or die 625(4)) than that between die 630 and die 625(1) (or die 625(3)).

The tile structure 600 in FIG. 6A applied for implementation of the integrated circuit 620 in FIG. 6B may be suitable when a higher data communication bandwidth is required between two pairs of dies (e.g., between die 630 and die 625(2) and between die 630 and die 625(4)). In one or more embodiments, die 625(3) (or some other die in FIG. 6B) can be different from other dies in FIG. 6B, i.e., die 625(3) can be a computer device (e.g., a printed circuit board) with an appropriate interface (e.g., PCI slots) for connecting the integrated circuit 620 with the integrated circuit 520 in FIG. 5B. Also, die 630 may be a TSP, a memory device (e.g., HBM device), an interface device (e.g., a bridge die), or some other device. It should be noted that die 630 when implemented as an interface device (e.g., bridge die) may be used to interface the integrated circuit 620 (e.g., via one or more quadrants) to a host computer, an HBM device, or some other device.

FIG. 7A illustrates an example top view and bottom view of an integrated circuit 700 comprising multiple tile structures (e.g., eight tile structures) mutually connected via a T2T bridge, in accordance with some embodiments. The integrated circuit 700 includes an array of tile structures 710A through 710H spanning across a first dimension (e.g., x dimension), second dimension (e.g., y dimension) orthogonal to the first dimension, and a third dimension (e.g., z dimension) orthogonal to the first and second dimensions. The tile structures in the array are interconnected into the integrated circuit 700 via a T2T bridge 715. The tile structures 710A, 710B, 710C, 710D are adjacent on two sides relative to each other and placed in the same 2D plane (e.g., across x and y dimensions), and the T2T bridge 715 is overlaid in a third dimension (e.g., z dimension). Similarly, the tile structures 710E, 710F, 710G, 710H are adjacent on two sides relative to each other and placed in the same 2D plane (e.g., across x and y dimensions), and the T2T bridge 715 is overlaid in a third dimension (e.g., z dimension). At least a subset of the tile structures 710A through 710H may be configured to function as a single core processor for model-parallelism across a plurality of dies of the tile structures 710A through 710H.

Each tile structure 710A through 710H may comprise a first die and a second die connected to the first die in the F2F configuration. The first die may be shifted relative to the second die by a first shift amount along the first dimension and by a second shift amount along the second dimension forming an offset alignment between the first die and the second die. The first die in each tile structure 710A through 710H may comprise a TSP, and the second die in each tile structure 710A through 710H may comprise another TSP, a memory device (e.g., HBM device), an interface device, some other device, or some combination thereof.

A top view 705A of the integrated circuit 700 illustrates the tile structures 710A, 710B, 710C, 710D mutually connected via a first side (e.g., top side) of the T2T bridge 715. Similarly, a bottom view 705B of the integrated circuit 700 illustrates the tile structures 710E, 710F, 710G, 710H mutually connected via a second side (e.g., bottom side) of the T2T bridge 715 opposite the first side. The T2T bridge is implemented as a bridge die with T2T pins (e.g., interconnection pads) on both sides of the bridge die. At least a subset of the T2T pins on the first side of the T2T bridge 715 aligns with corresponding T2T pins of the tile structures 710A, 710B, 710C, 710D. Similarly, at least a subset of the T2T pins on the second side of the T2T bridge 715 aligns with corresponding T2T pins of the tile structures 710E, 710F, 710G, 710H. Thus, the integrated circuit 700 effectively includes two horizontal layers of tile structures—a first horizontal layer of tile structures 710A, 710B, 710C, 710D and a second horizontal layer of tile structures 710E, 710F, 710G, 710H interconnected along a vertical dimension (e.g., z dimension) via the T2T bridge 715.

Figure 7B:
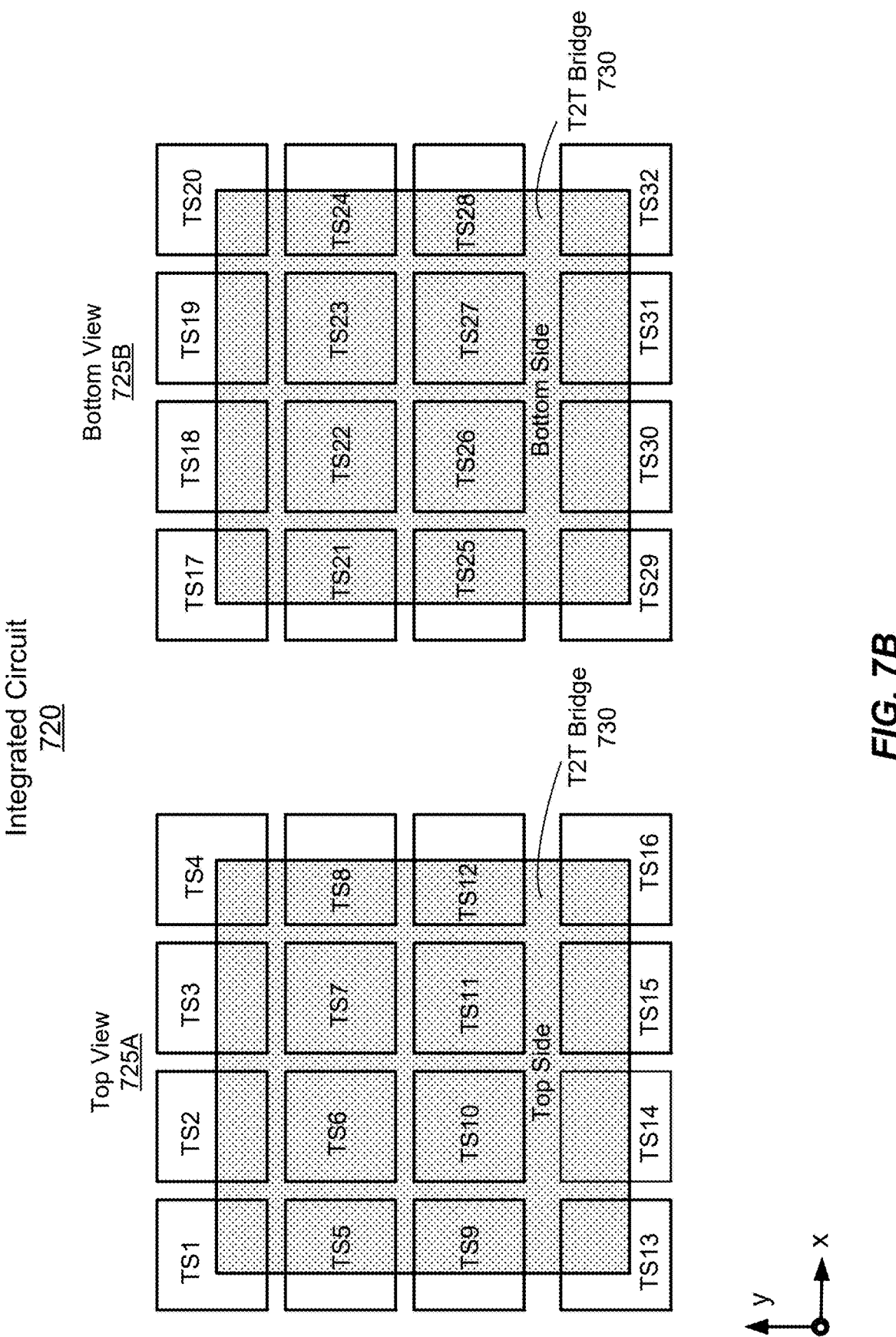
FIG. 7B illustrates another example top view and bottom view of an integrated circuit comprising multiple tile structures mutually connected via a T2T bridge, in accordance with some embodiments.

FIG. 7B illustrates an example top view and bottom view of an integrated circuit 720 comprising multiple tile structures (e.g., 32 tile structures) mutually connected via a T2T bridge, in accordance with some embodiments. The integrated circuit 720 includes an array of tile structures TS1 through TS32 spanning across a first dimension (e.g., x dimension), a second dimension (e.g., y dimension) orthogonal to the first dimension, and a third dimension (e.g., z dimension) orthogonal to the first and second dimensions. The tile structures in the array are interconnected into the integrated circuit 720 via a T2T bridge 730. In a preferred embodiment, the T2T bridge 730 interconnects with each tile structure in the array using a corresponding TSV interconnect the T2T bridge 730. Accordingly, the tile structures TS1 through TS32 are not necessarily in the stacked, offset configuration, but rather the tile structures TS1 through TS32 may be in stacked configurations via TSVs of the T2T bridge 730 providing the tile structure to tile structure interconnect. At least a portion of the tile structures TS1 through TS32 may be configured to function as a single core processor for model-parallelism across a plurality of dies of the tile structures TS1 through TS32.

Each tile structure TS1 through TS32 may, in one embodiment, have the same configuration as the tile structure 200.

Thus, each tile structure TS1 through TS32 may comprise a first die and a second die that is connected to the first die in the F2F configuration. The first die may be shifted relative to the second die by a first shift amount along the first dimension and by a second shift amount along the second dimension forming an offset alignment between the first die and the second die. The first die in each tile structure TS1 through TS32 may comprise a TSP, and the second die in each tile structure TS1 through TS32 may comprise another TSP, a memory device (e.g., HBM device), an interface device, some other device, or some combination thereof.

A top view 725A of the integrated circuit 720 illustrates the tile structures TS1 through TS16 mutually connected via a first side (e.g., top side) of the T2T bridge 730. Similarly, a bottom view 725B of the integrated circuit 720 illustrates the tile structures TS17 through TS32 mutually connected via a second side (e.g., bottom side) of the T2T bridge 730 opposite the first side. The T2T bridge 730 is implemented as a bridge die with T2T pins (e.g., T2T interconnection pads) on both sides of the bridge die. At least a subset of the T2T pins on the first side of the T2T bridge 730 aligns with corresponding T2T pins (i.e., TSVs) of the tile structures TS1 through TS16. Similarly, at least a subset of the T2T pins on the second side of the T2T bridge 730 aligns with corresponding T2T pins (i.e., TSVs) of the tile structures TS17 through TS32. Thus, the integrated circuit 720 effectively includes two horizontal layers of tile structures—a first horizontal layer of tile structures TS1 through TS16 and a second horizontal layer of tile structures TS17 through TS32 interconnected along a vertical dimension (e.g., z dimension) via the T2T bridge 730.

Figure 8A:
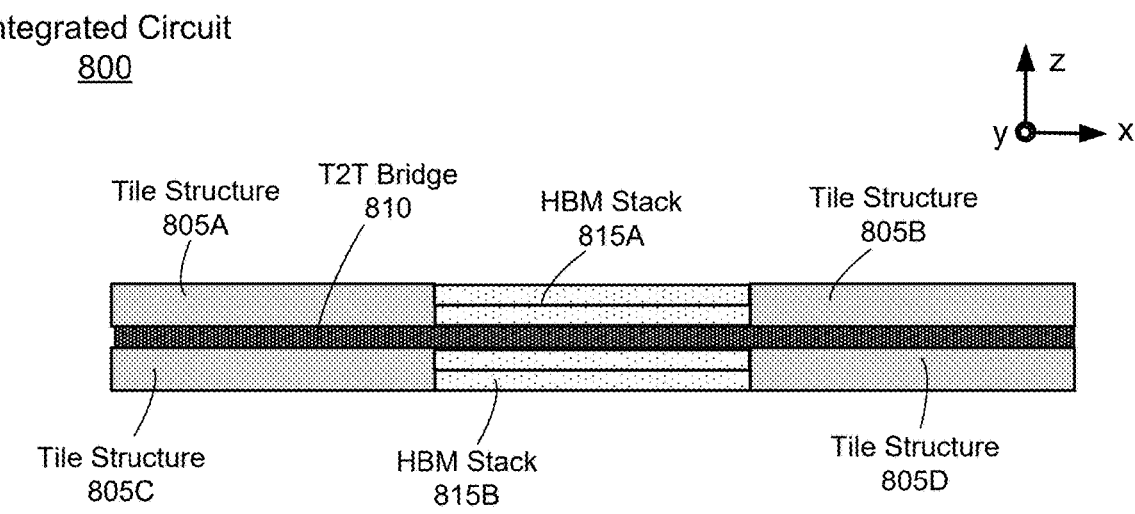
FIG. 8A illustrates an example integrated circuit that includes tile structures and stacks of HBMs mutually connected via a T2T bridge, in accordance with some embodiments.

FIG. 8A illustrates an example side view of an integrated circuit 800 that includes multiple tile structures and stacks of HBMs mutually connected via a T2T bridge, in accordance with some embodiments. The integrated circuit 800 includes tile structures 805A, 805B (and at least two more tile structures not shown in FIG. 8A) mutually connected via a first side (e.g., top side) of a T2T bridge 810 (e.g., in the configuration shown by the top view 705A in FIG. 7A). The integrated circuit 800 further includes tile structures 805C, 805D (and at least two more tile structures not shown in FIG. 8A) mutually connected via a second side (e.g., bottom side) of the T2T bridge 810 (e.g., in the configuration shown by the bottom view 705B in FIG. 7A). The T2T bridge 810 may be an embodiment of the T2T bridge 715 or the T2T bridge 730.

Each tile structure in the integrated circuit 800 may have the same configuration as the tile structure 200. Alternatively, each tile structure in the integrated circuit 800 may include a pair of dies connected via TSVs to provide connections through the backside of a die. A first die in each tile structure of the integrated circuit 800 may comprise a TSP, and a second die in each tile structure of the integrated circuit 800 may comprise another TSP, a memory device (e.g., HBM device), an interface device, some other device, or some combination thereof. A number of tile structures connected via the top side of the T2T bridge 810 is 4N, a number of tile structures connected via the bottom side of the T2T bridge 810 is 4N, and N is an integer. Thus, the total number of tile structures in the integrated circuit 800 may be 8N (e.g., N=1, 2, 3, or 4).

The integrated circuit 800 further includes a first stack 815A of memory devices (e.g., stack of HBM devices) placed on the first side of the T2T bridge 810, e.g., spatially between the tile structure 805A and the tile structure 805B. The HBM stack 815A may comprise one or more HBMs stacked on top of each other in the F2B configuration or in the B2B configuration (e.g., via TSV connectors). The integrated circuit 800 further includes a second stack 815B of memory devices (e.g., stack of HBM devices) placed on the second side of the T2T bridge 810, e.g., spatially between the tile structure 805C and the tile structure 805D. The HBM stack 815B may comprise one or more HBMs stacked on top of each other in the F2B configuration or in the B2B configuration (e.g., via TSV connectors). The tile structures in the integrated circuit 800 along with the HBM stacks 815A, 815B may function as a single core processor for model-parallelism across a plurality of dies of the tile structures and HBMs.

Figure 8B:
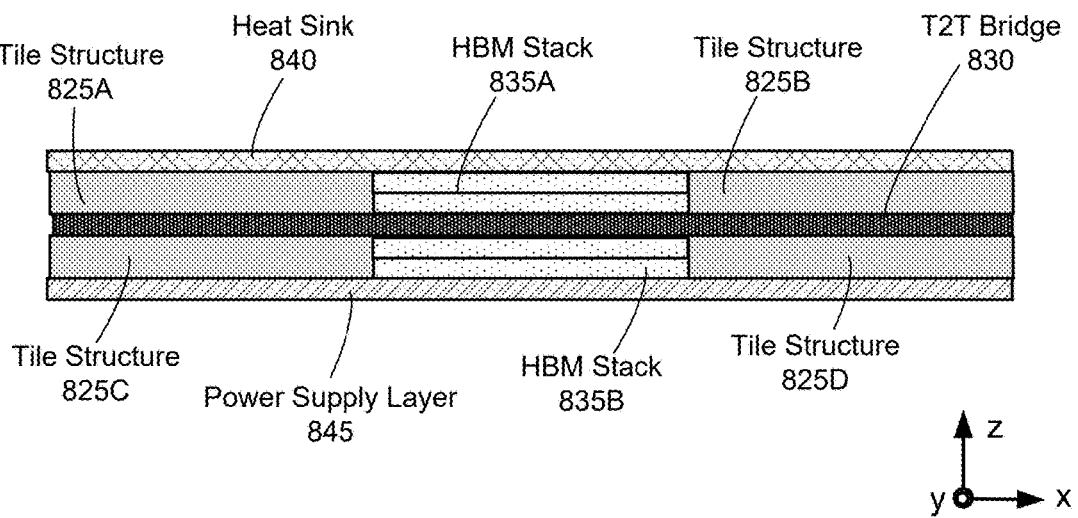
FIG. 8B illustrates an example integrated circuit that includes tile structures and stacks of HBMs mutually connected via a T2T bridge with a heat sink, in accordance with some embodiments.

FIG. 8B illustrates an example side view of an integrated circuit 820 that includes multiple tile structures and stacks of HBMs mutually connected via a T2T bridge with a heat sink, in accordance with some embodiments. The integrated circuit 820 includes tile structures 825A, 825B (and at least two more tile structures not shown in FIG. 8B) mutually connected via a first side (e.g., top side) of a T2T bridge 830 (e.g., in the configuration shown by the top view 705A in FIG. 7A). The integrated circuit 820 further includes tile structures 825C, 825D (and at least two more tile structures not shown in FIG. 8B) mutually connected via a second side (e.g., bottom side) of the T2T bridge 830 (e.g., in the configuration shown by the bottom view 705B in FIG. 7A). The T2T bridge 830 may be an embodiment of the T2T bridge 715 or the T2T bridge 730. Each tile structure in the integrated circuit 820 may have the same configuration as the tile structure 200. Alternatively, each tile structure in the integrated circuit 820 may include a pair of dies connected via TSVs to provide connections through the backside of a die. A first die in each tile structure of the integrated circuit 800 may comprise a TSP, and a second die in each tile structure of the integrated circuit 800 may comprise another TSP, a memory device (e.g., HBM device), an interface device, some other device, or some combination thereof.

The integrated circuit 820 further includes a first stack 835A of memory devices (e.g., stack of HBM devices) placed on the first side of the T2T bridge 830, e.g., spatially between the tile structure 825A and the tile structure 825B. The HBM stack 835A may comprise one or more HBMs stacked on top of each other in the F2B configuration or in the B2B configuration (e.g., via TSV connectors). The integrated circuit 820 further includes a second stack 835B of memory devices (e.g., stack of HBM devices) placed on the second side of the T2T bridge 830, e.g., spatially between the tile structure 825C and the tile structure 825D. The HBM stack 835B may comprise one or more HBMs stacked on top of each other in the F2B configuration or in the B2B configuration (e.g., via TSV connectors). The tile structures in the integrated circuit 820 along with the HBM stacks 835A, 835B may function as a single core processor for model-parallelism across a plurality of dies of the tile structures and HBMs.

The integrated circuit 820 further includes a heat sink 840 coupled to outer surfaces of the tile structures 825A, 825B (and any additional tile structures coupled to the first side of the T2T bridge 830) and the HBM stack 835A. The heat sink 840 may be configured to dissipate heat from the tile structures 825A through 825D (and any additional tile structures coupled to the first and second sides of the T2T bridge 830) and the HBM stacks 835A, 835B. In one or more embodiments, the heat sink 840 is implemented as a heat sink die comprising, e.g., a metal layer formed on top of a substrate. In one or more other embodiments, the heat sink 840 can be implemented as a thermal filler filling gaps between tile structures. For example, a thermal filler of the heat sink 840 may fill gaps between the tile structure 825A and the tile structure 825B (and any additional tile structures coupled to the first side of the T2T bridge 830). A thermal filler of the heat sink 840 may be, e.g., silicon (graphene based) filler or graphene tube placed on a copper cold plate in contact with silicon. The heat sink 840 may include water cooling, fins, or provide contact to other thermal dissipation structures.

The integrated circuit 820 may further include a power supply layer 845, e.g., coupled to outer surfaces of the tile structures 825C, 825D (and any additional tile structures coupled to the second side of the T2T bridge 830) and the HBM stack 835B. The power supply layer 845 may include an array of C4 bumps to provide power supply networks for lower layers of silicon in the integrated circuit 820 (e.g., lower dies of HBM stack 835B, lower dies of the tile structures 825C, 825D and any additional tile structures coupled to the second side of the T2T bridge 830). Other dies (i.e., upper layers of silicon) in the integrated circuit 820 may include power delivery via TSV connectors.

Figure 9:
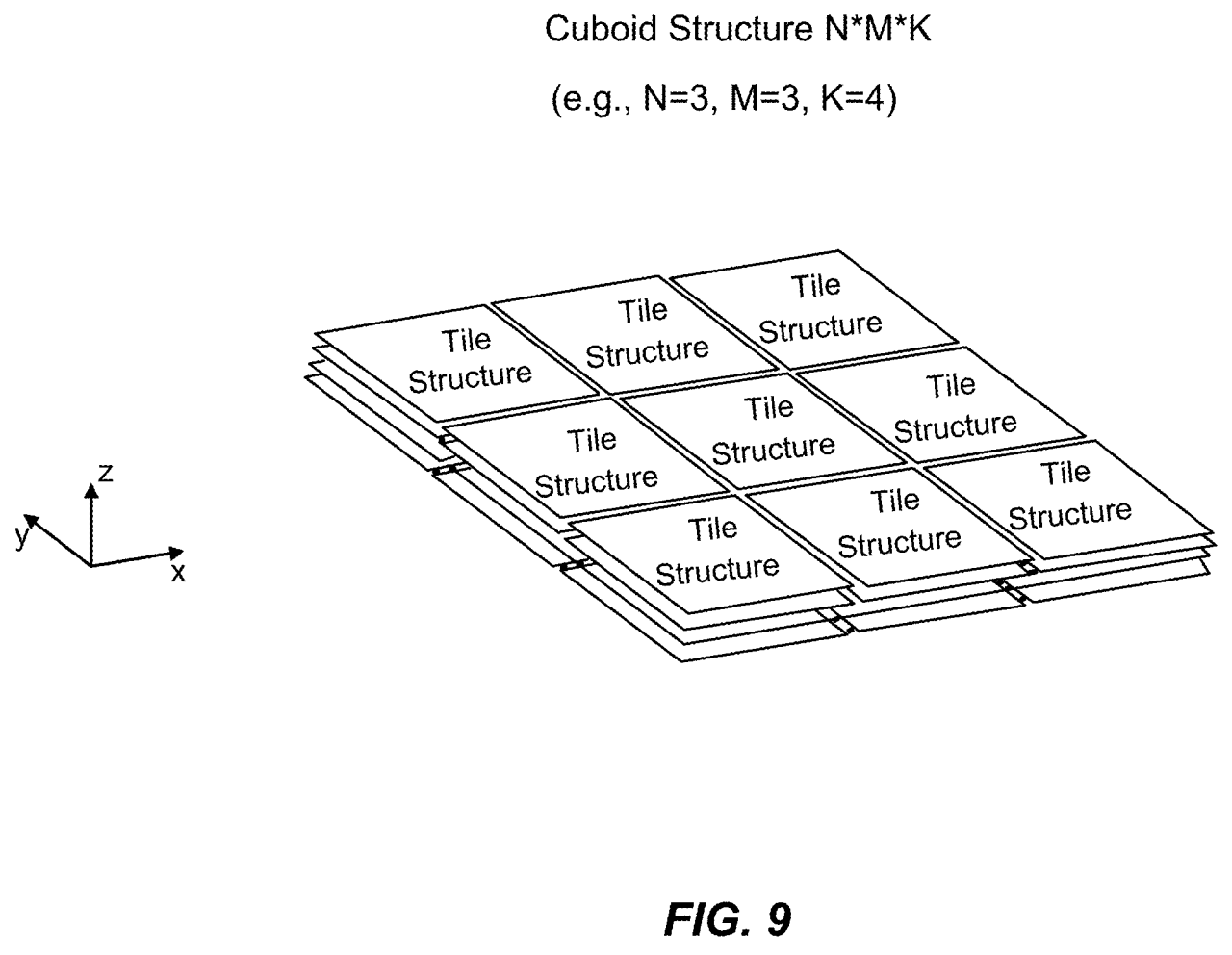

FIG. 9 illustrates an example integrated circuit implemented as a cuboid structure 900 of tile structures, in accordance with some embodiments. The cuboid structure 900 represents a three-dimensional array of interconnected tile structures, i.e., an array of N×M×K tile structures spanning across the three spatial dimensions (e.g., x dimension, y dimension and z dimension, respectively), where N, M and K are integers (e.g., less than 5). Each of the tile structures in the cuboid structure 900 may have a configuration of the tile structure 200. Alternatively, each tile structure in the cuboid structure 900 may include a pair of dies connected via TSVs to provide connections through the backside of a die. The tile structures of the cuboid structure 900 may be configured to operate as a single core processor for model-parallelism across the tile structures.

As shown in FIG. 9, the cuboid structure 900 includes a plurality of horizontal layers of tiles structures that are interconnected vertically (e.g., along z dimension). Each horizontal layer of tile structures includes a two-dimensional array (e.g., N×M array) of tile structures spanning across a first dimension (e.g., x dimension) and a second dimension (e.g., y dimension). A pair of adjacent tile structures in each horizontal layer may be interconnected via an offset alignment formed between a pair of dies in each tile structure (e.g., as shown in FIG. 4). A pair of adjacent horizontal layers of tile structures are connected along a vertical dimension (e.g., z dimension) by coupling corresponding tile structures in the adjacent horizontal layers along the vertical dimension (e.g., z dimension). The number of horizontal layers of tile structures connected along the vertical dimension (e.g., z dimension) is K (e.g., K=4 in the embodiment of FIG. 9). In one embodiment, the corresponding tile structures in the adjacent horizontal layers are coupled to each other along the vertical dimension (e.g., z dimension) in the B2B configuration via TSV connectors. In another embodiment, the corresponding tile structures in the adjacent horizontal layers are coupled to each other along the vertical dimension (e.g., z dimension) in the F2B configuration via TSV connectors. In yet another embodiment, the corresponding tile structures in the adjacent horizontal layers are coupled along the vertical dimension (e.g., z dimension) via a T2T bridge (e.g., as shown in FIGS. 7A-7B). In some embodiments, two adjacent horizontal layers in the cuboid structure 900 are mutually coupled by connecting their tile structures in the B2B configuration, whereas another two adjacent horizontal layers in the cuboid structure 900 are mutually coupled by connecting their tile structures in the F2B configuration.

The cuboid structure 900 may further include a plurality of heatsinks (not shown in FIG. 9). Each heatsink in the cuboid structure 900 may be directly connected to at least one tile structure in the cuboid structure 900 and configured to dissipate heat from the at least one tile structure. Each heatsink may be implemented as, e.g., silicon (graphene based) filler, a graphene tube placed on a copper cold plate in contact with silicon, a metal layer on a substrate, some other type of heatsink, or combination thereof. In one or more embodiments, each heatsink is placed between two adjacent horizontal layers of tile structures and is configured to dissipate heat from the two adjacent horizontal layers of tile structures. Additionally, a pair of heatsinks may be placed on a top surface of the cuboid structure 900 and on a bottom surface of the cuboid structure 900 (e.g., relative to a vertical or z dimension), and may be configured to dissipate heat from outer horizontal layers of tile structures in the cuboid structure 900.

In some embodiments, a compiler controlling data operations performed on dies of the cuboid structure 900 can be configured to provide a specific silicon-to-power tradeoff, e.g., by running twice the number of dies of the cuboid structure 900 at 50% of a maximum defined clock rate. Additionally, or alternatively, the compiler can map utilization to resources within the cuboid structure 900 to stagger heat generation and optimize local heating of dies and tile structures. In one or more embodiments, each die of the tile structures in the cuboid structure 900 can be of a different size and/or perform different functions. The per-die granularity of size and functionality of the cuboid structure 900 can be exploited by the compiler for optimizing silicon-to-power tradeoff at the cuboid structure 900.

In some embodiments, one or more cuboid structures 900 are housed in a rack and can be employed in a data center. The data center may contain thousands of such racks. Each cuboid structure 900 in the rack may be configured to operate as a single core deterministic streaming processor (e.g., a TSP) that runs a corresponding model (e.g., a machine learning model) or a plurality of such models. Thus, multiple models can be executed asynchronously across the multiple cuboid structures 900 in the rack. The rack may further include a central controller that controls (e.g., via a compiler running on the central controller) operations of each cuboid structure 900 in the rack. If the data center features a threshold power budget for an entire rack, each cuboid structure 900 can be individually managed to allocate power among all the cuboid structures 900 in the rack. Advantageously, not only is power managed to prevent the threshold power budget to be exceeded, but the quality of service (QoS) across each cuboid structure 900 in the rack is also maintained.

Example Process Flow

FIG. 10 is a flowchart illustrating a method 1000 of using an integrated circuit for data processing with model-parallelism across a plurality of dies of one or more tile structures, in accordance with some embodiments. The integrated circuit can further include at least one computer processor (e.g., a deterministic streaming processor) and a non-transitory computer-readable storage medium for storing computer executable instructions. The deterministic streaming processor may be a TSP. In one or more embodiments, the integrated circuit includes one tile structure with a pair of dies that may operate as a single core deterministic streaming processor. In such an instance, the integrated circuit may be an embodiment of, e.g., the tile structure 200, the tile structure 300, the tile structure 500, or the tile structure 600. In one or more other embodiments, the integrated circuit includes a two-dimensional array of tile structures that may operate as a single core deterministic streaming processor. In such an instance, the integrated circuit may be an embodiment of, e.g., one of the integrated circuits 410, 415, 420, 425, 520, 620. In one or more other embodiments, the integrated circuit includes a three-dimensional array of tile structures that may operate as a single core deterministic streaming processor. In such an instance, the integrated circuit may be an embodiment of, e.g., one of the integrated circuits 700, 800, 820 or of the cuboid structure 900.

The operations of method 1000 may be initiated by a compiler operating on at least one computer processor and/or on a host server separate from the integrated circuit. The compiler may utilize as its input a model (e.g., a machine learning model) for the deterministic streaming processor and outputs instructions for configuring operation of the deterministic streaming processor and the integrated circuit as a whole. The integrated circuit initiates 1005 issuance of instructions for execution by processing units (e.g., computational elements of one or more functional slices) across a plurality of dies of one or more tile structures of the integrated circuit. The integrated circuit initiates 1010 streaming of data through the processing units across the plurality of dies of the one or more tile structures for execution of the instructions. The integrated circuit initiates 1015 returning of resulting data to one or more memory slices of the one or more tile structures. In other embodiments, data is initially retained in an HBM and moved to one or more TSP devices comprising the tile structures in accordance with instructions executed by the one or more TSP devices of the integrated circuit. Each TSP device may move results from its on-board memory to an HBM memory for subsequent transfer or use by a host processor (e.g., the at least one computer processor and/or the host server).

Example Computer System Architecture

Figure 11A:
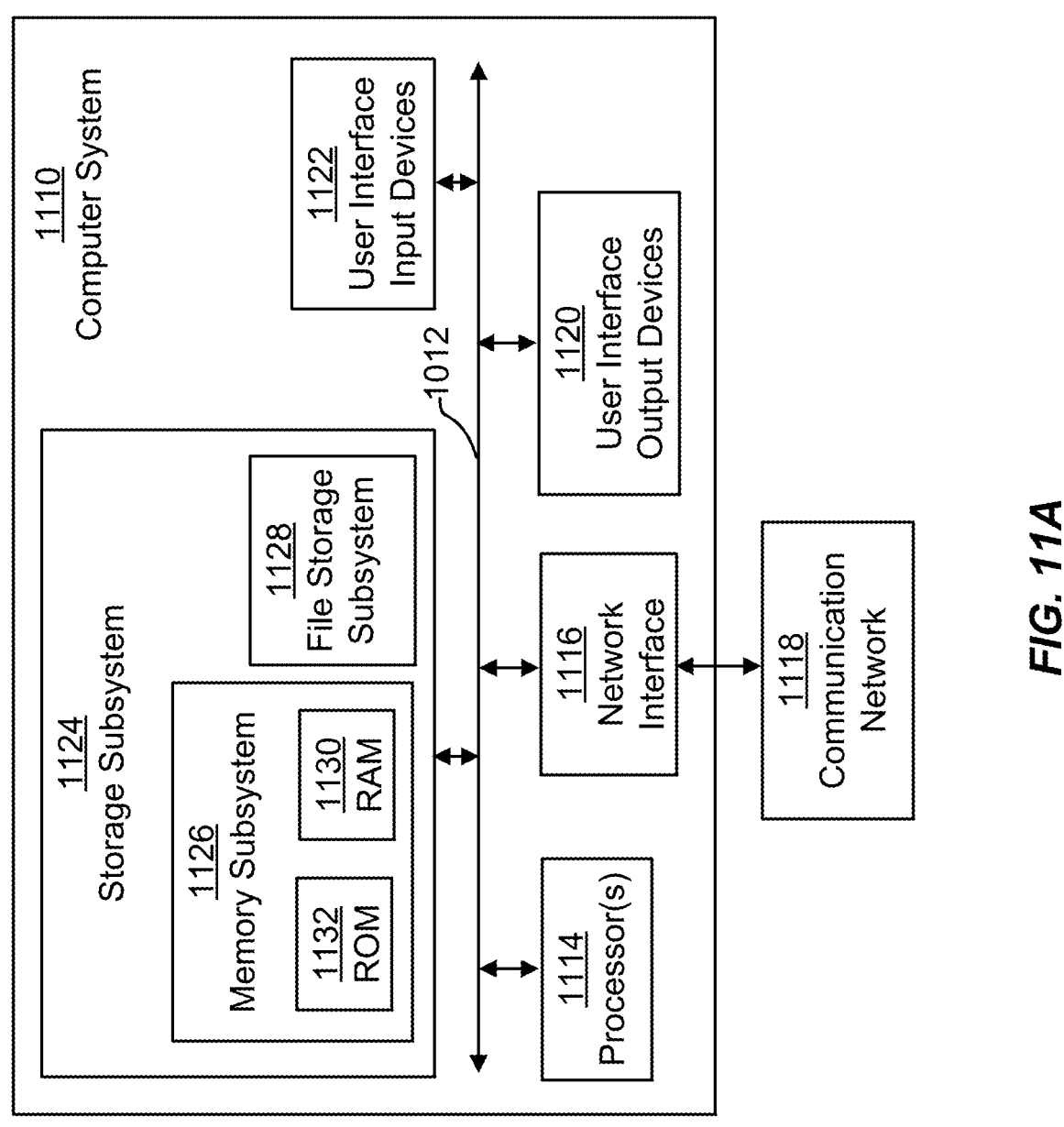
FIG. 11A is an abstract diagram of an example computer system suitable for enabling embodiments of the claimed disclosures for use in commerce, in accordance with some embodiments.

FIG. 11A is an abstract diagram of an example computer system suitable for enabling embodiments of the claimed disclosures, in accordance with some embodiments. In some embodiments described herein, a host processor may comprise the computer system of FIG. 11A.

In FIG. 11A, the structure of computer system 1110 typically includes at least one computer 1114 which communicates with peripheral devices via bus subsystem 1112. Typically, the computer includes a processor (e.g., a microprocessor, graphics processing unit, or digital signal processor), or its electronic processing equivalents, such as an ASIC or FPGA. Typically, peripheral devices include a storage subsystem 1124, comprising a memory subsystem 1126 and a file storage subsystem 1128, user interface input devices 1122, user interface output devices 1120, and/or a network interface subsystem 1116. The input and output devices enable direct and remote user interaction with computer system 1110. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, for example, MICROSOFT WINDOWS, APPLE MACOS and IOS, GOOGLE ANDROID, Linux and/or Unix. The computer system typically includes a Basic Input/Output System (BIOS) and processor firmware. The operating system, BIOS and firmware are used by the processor to structure and control any subsystems and interfaces connected to the processor. Example processors that enable these operating systems include: the Pentium, Itanium, and Xeon processors from INTEL; the Opteron and Athlon processors from AMD (ADVANCED MICRO DEVICES); the Graviton processor from AMAZON; the POWER processor from IBM; the SPARC processor from ORACLE; and the ARM processor from ARM Holdings.

Any embodiment of the present disclosure is limited neither to an electronic digital logic computer structured with programs nor to an electronically programmable device. For example, the claimed embodiments can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 1110 depicted in FIG. 11A is intended only as an example. Many other structures of computer system 1110 have more components than the computer system depicted in FIG. 11A.

Network interface subsystem 1116 provides an interface to outside networks, including an interface to communication network 1118, and is coupled via communication network 1118 to corresponding interface devices in other computer systems or machines. Communication network 1118 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 1118 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or Integrated Services Digital Network (ISDN)), (asynchronous) digital subscriber line (DSL) unit, Firewire interface, universal serial bus (USB) interface, and the like. Communication algorithms ('protocols') can be specified using one or communication languages, such as Hypertext Transfer Protocol (HTTP), Transmission Control Protocol/Internet Protocol (TCP/IP), Real-time Transport Protocol/Real Time Streaming Protocol (RTP/RTSP), Internetwork Packet Exchange (IPX) protocol and/or User Datagram Protocol (UDP).

User interface input devices 1122 can include an alpha-numeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 1110 or onto communication network 1118. User interface input devices typically enable a user to select objects, icons, text and the like that appear on some types of user interface output devices, for example, a display subsystem.

User interface output devices 1120 can include a display subsystem, a printer, a fax machine, or a non-visual communication device such as audio and haptic devices. The display subsystem can include a CRT, a flat-panel device such as an LCD, an image projection device, or some other device for creating visible stimuli such as a virtual reality system. The display subsystem can also provide non-visual stimuli such as via audio output, aroma generation, or tactile/haptic output (e.g., vibrations and forces) devices. Typically, the term 'output device' signifies all possible types of devices and processes to transfer data and information out of computer system 1110 to the user or to another machine or computer system. Such devices are connected by wire or wirelessly to a computer system. Note that some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits that use any of the above input or output devices.

Memory subsystem 1126 typically includes several memories including a main RAM 1130 (or other volatile storage device) for storage of instructions and data during program execution and a ROM 1132 in which fixed instructions are stored. File storage subsystem 1128 provides persistent storage for program and data files, and can include a hard disk drive, a floppy disk drive along with associated removable media, a CD-ROM drive, an optical drive, a flash memory such as a USB drive, or removable media cartridges. If computer system 1110 includes an input device that performs optical character recognition, then text and symbols printed on a physical object (such as paper) can be used as a device for storage of program and data files. The databases and modules used by some embodiments can be stored by file storage subsystem 1128.

Bus subsystem 1112 provides a device for transmitting data and information between the various components and subsystems of computer system 1110. Although bus subsystem 1112 is depicted as a single bus, alternative embodiments of the bus subsystem can use multiple buses. For example, a main memory using RAM can communicate directly with file storage systems using DMA systems.

Figure 11B:
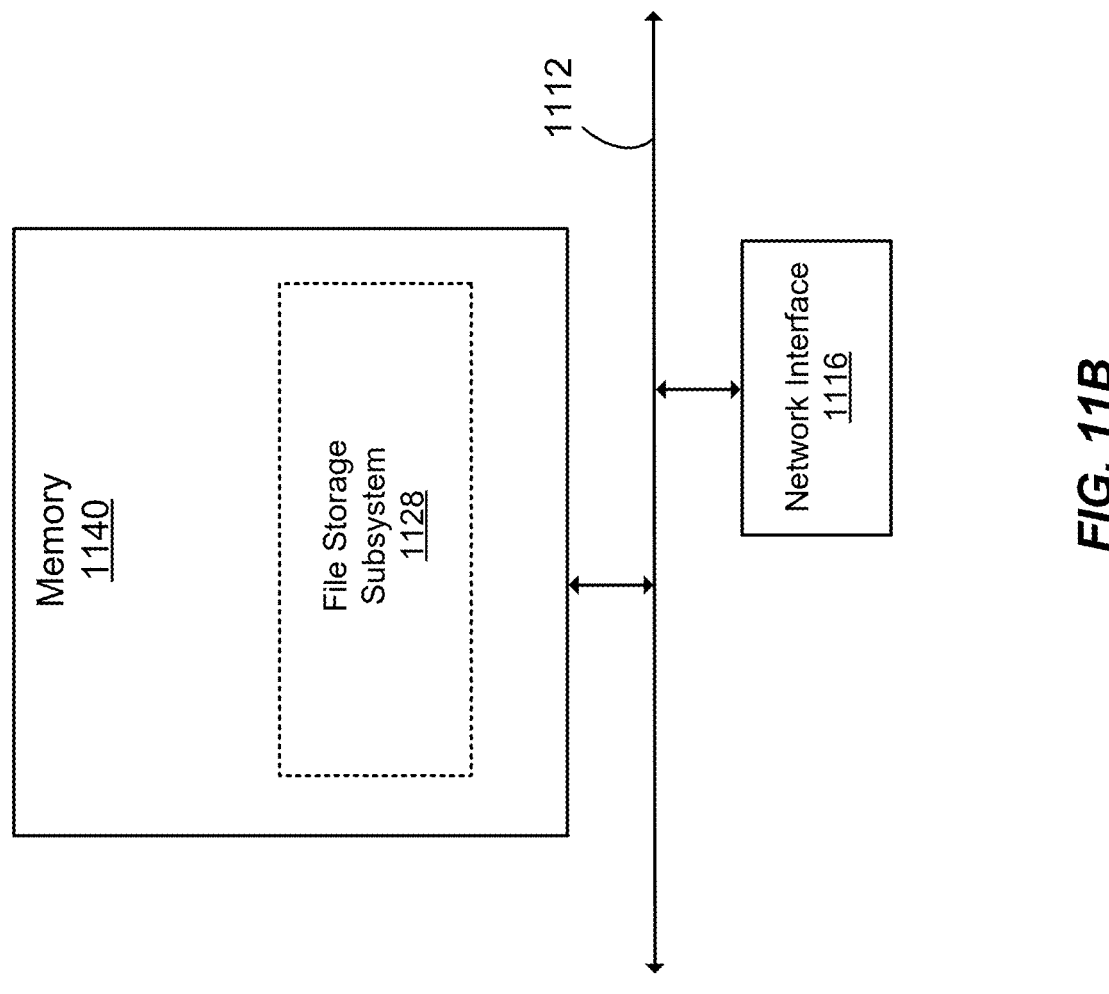
FIG. 11B is another abstract diagram of an example computer system suitable for enabling embodiments of the claimed disclosures for use in commerce, in accordance with some embodiments.

FIG. 11B is another abstract diagram of a computer system suitable for enabling embodiments of the claimed disclosures, in accordance with some embodiments. In some embodiments described herein, a host processor may comprise the computer system of FIG. 11B.

FIG. 11B depicts a memory 1140 such as a non-transitory, processor readable data and information storage medium associated with file storage subsystem 1128, and/or with network interface subsystem 1116 (e.g., via bus subsystem 1112), and can include a data structure specifying a circuit design. The memory 1140 can be a hard disk, a floppy disk, a CD-ROM, an optical medium, removable media cartridge, or any other medium that stores computer readable data in a volatile or non-volatile form, such as text and symbols on a physical object (such as paper) that can be processed by an optical character recognition system. A program transferred into and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

One skilled in the art will recognize that any of the computer systems illustrated in FIGS. 11A-11B comprises a machine for performing a process that achieves an intended result by managing work performed by controlled electron movement.

Additional Example Computing System

Figure 12:
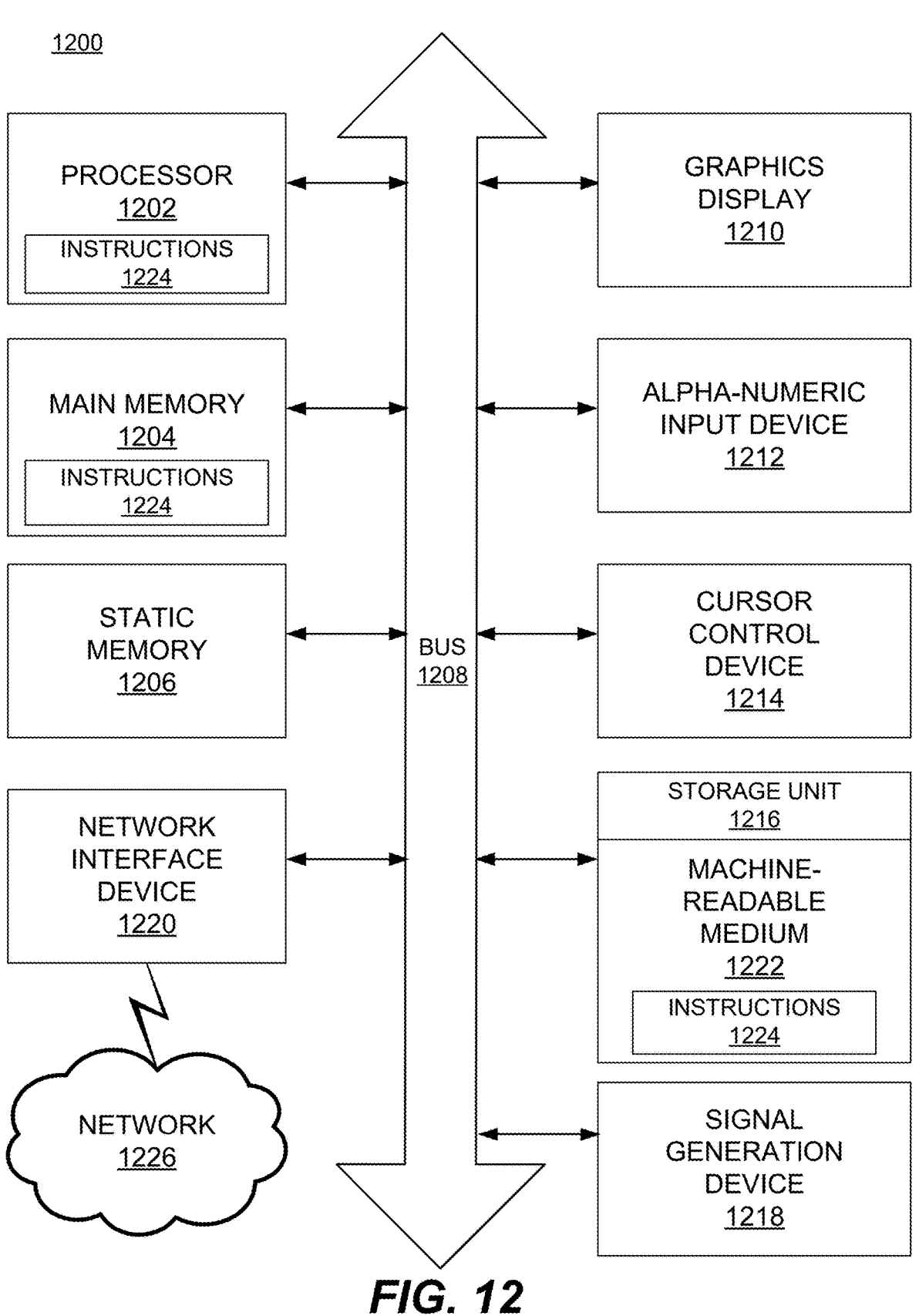
FIG. 12 illustrates an additional example computing machine for use in commerce, in accordance with some embodiments.

FIG. 12 is a block diagram illustrating components of an example computing machine that is capable of reading instructions from a computer-readable medium and executing them in a processor (or controller) according to an embodiment. A computer described herein may include a single computing machine shown in FIG. 12, a virtual machine, a distributed computing system that includes multiple nodes of computing machines shown in FIG. 12, or any other suitable arrangement of computing devices. The computer described herein may be used by any of the elements described in the previous figures to execute the described functions.

By way of example, FIG. 12 depicts a diagrammatic representation of a computing machine in the example form of a computer system 1200 within which instructions 1224 (e.g., software, program code, or machine code), which may be stored in a computer-readable medium, causing the machine to perform any one or more of the processes discussed herein. In some embodiments, the computing machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The structure of a computing machine described in FIG. 12 may correspond to any software, hardware, or combined components shown in the figures above. By way of example, a computing machine may be a tensor streaming processor designed and manufactured by GROQ, INC. of Mountain View, California, a personal computer (PC), a tablet PC, a set-top box (STB), a personal digital assistant (PDA), a cellular telephone, a smartphone, a web appliance, a network router, an internet of things (IoT) device, a switch or bridge, or any machine capable of executing instructions 1224 that specify actions to be taken by that machine. Further, while only a single machine is illustrated, the term "machine" shall also be taken to include any collection of machines that individually or jointly execute instructions 1224 to perform any one or more of the methodologies discussed herein.

The example computer system 1200 includes one or more processors (generally, a processor 1202) (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 1204, and a static memory 1206, which are configured to communicate with each other via a bus 1208. The computer system 1200 may further include graphics display unit 1210 (e.g., a plasma display panel (PDP), a liquid crystal display (LCD), a projector, or a cathode ray tube (CRT)). The computer system 1200 may also include alphanumeric input device 1212 (e.g., a keyboard), a cursor control device 1214 (e.g., a mouse, a trackball, a joystick, a motion sensor, or other pointing instrument), a storage unit 1216, a signal generation device 1218 (e.g., a speaker), and a network interface device 1220, which also are configured to communicate via the bus 1208.

The storage unit 1216 includes a computer-readable medium 1222 on which the instructions 1224 are stored embodying any one or more of the methodologies or functions described herein. The instructions 1224 may also reside, completely or at least partially, within the main memory 1204 or within the processor 1202 (e.g., within a processor's cache memory). Thus, during execution thereof by the computer system 1200, the main memory 1204 and the processor 1202 may also constitute computer-readable media. The instructions 1224 may be transmitted or received over a network 1226 via the network interface device 1220.

While the computer-readable medium 1222 is shown in an example embodiment to be a single medium, the term "computer-readable medium" should be taken to include a single medium or multiple media (e.g., a centralized or distributed database, or associated caches and servers) able to store instructions (e.g., the instructions 1224). The computer-readable medium 1222 may include any medium that is capable of storing instructions (e.g., the instructions 1224) for execution by the machine and that cause the machine to perform any one or more of the methodologies disclosed herein. The computer-readable medium 1222 may include, but not be limited to, data repositories in the form of solid-state memories, optical media, and magnetic media. The computer-readable medium 1222 does not include a transitory medium such as a signal or a carrier wave.

ADDITIONAL CONSIDERATIONS

The disclosed configurations may have benefits and advantages that include, for example, a more efficient data flow by separating the functions of the processor into specialized functional units, and configuring the timing of data and instructions to each functional unit, such that each unit is able operate on received data based upon a known timing between received data and instructions. Because the compiler for the processor is hardware aware, it is able to configure an explicit plan for the processor indicating how and when instructions and data operands are transmitted to different tiles of the processor. By accounting for the timing of received instructions and data, the data can be transmitted between the tiles of the processor without unnecessary metadata, increasing the efficiency of the transmission. In addition, by separating the transmission of data and instructions, instructions can be iterated and looped independent of received data operands.

In addition, because each computational element of the processor is dedicated to a specific function (e.g., MEM, VXM, MXM, SXM), the amount of instructions needed to be processed by the computational elements may be reduced. For example, certain computational elements (e.g., in MXM functional slice) may be configured to perform a limited set of operations on any received data. As such, these computational elements may be able to operate without having to receive explicit instructions or only receiving intermittent or limited instructions, potentially simplifying operation of the processor. For example, data operands read from memory can be intercepted by multiple functional slices as the data is transmitted across a data lane, allowing for multiple operations to be performed on the data in a more efficient manner.

In operation, a host computer programs a DMA engine to actually transfer data, again all of which is coordinated by the runtime layer. Specifically, the IDU transfers 320-byte vectors from PCIe-Gen4 32-bytes every core-clock cycle (e.g., nominal 900 Mhz). Thus, the 320-element vector arrives over a period of 10 cycles and placed on multiple streams moving towards the MEM. The incoming streams flow on S24-31 (upper eight streams), from which the MEM performs a "write" to commit that vector to SRAM. Hence, a PCI-Receive consists of (i) receiving the data from the PCI interface, and (ii) writing the vector into the specified functional slice of the MEM.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Some embodiments of the present disclosure may further relate to a system comprising a processor (e.g., a tensor streaming processor or an artificial intelligence processor), at least one computer processor (e.g., a host server), and a non-transitory computer-readable storage medium. The storage medium can store computer executable instructions, which when executed by the compiler operating on the at least one computer processor, cause the at least one computer processor to be operable for performing the operations and techniques described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An integrated circuit, comprising:
a processor implemented via a tile structure that comprises a first die and a second die connected to the first die, wherein the first die comprises one or more matrix arithmetic functional units and one or more first stream registers configured to stream data in a first direction, the second die comprises one or more matrix arithmetic functional units and one or more second stream registers configured to stream data in a second direction opposite the first direction, the one or more second stream registers are coupled to the one or more first stream registers, the processor enables model parallelism across the first die and the second die, the first die is shifted relative to the second die by a first shift amount along a first dimension forming a ledge and by a second shift amount along a second dimension forming a shelf, the second dimension is orthogonal to the first dimension, and the first die and the second die overlap one another excluding respective portions of the first die and the second die that form the shelf and the ledge.

2. The integrated circuit of claim 1, wherein the second die is connected to the first die in a face-to-face (F2F) configuration forming the tile structure, the F2F configuration forms the ledge that comprises a first plurality of electrical connection pads and the shelf that comprises a second plurality of electrical connection pads, and wherein at least one ledge overlaps with at least one shelf of an adjacent tile in an array of tile structures.

3. The integrated circuit of claim 1, further comprising:
a plurality of die-to-die (D2D) connection pads of the first die and the second die; and
a plurality of tile-to-tile (T2T) connection pads of the first die and the second die, wherein
data communication is facilitated between the first die and the second die in the tile structure via electrical connections being formed by at least a portion of the D2D connection pads on the first die and the second die, and
the tile structure is directly connected to another tile structure via electrical connections formed by at least a portion of the T2T connection pads.

4. The integrated circuit of claim 1, wherein the integrated circuit comprises an M by N array of tile structures including the tile structure spanning across the first dimension and the second dimension, wherein M is a first integer greater than one, and wherein N is the first integer or a second integer greater than one.

5. The integrated circuit of claim 4, wherein the array of tile structures is configured to function as the processor that enables model-parallelism across a plurality of dies of the array of tile structures, and wherein the processor is a single core processor.

6. The integrated circuit of claim 1, further comprising:
a third die;
a fourth die; and
a fifth die,
the fifth die connected to the first die via a first set of die-to-die (D2D) pins of the first die and the fifth die,
the fifth die connected to the second die via a second set of D2D pins of the second die and the fifth die,
the fifth die connected to the third die via a third set of D2D pins of the third and fifth dies, and
the fifth die connected to the fourth die via a fourth set of D2D pins of the fourth die and the fifth die.

7. The integrated circuit of claim 1, wherein:
the first die comprises a first tensor streaming processor (TSP) having a first plurality of functional units; and
the second die comprises one of: a second TSP having a second plurality of functional units, a high-bandwidth memory, and an interface chip.

8. The integrated circuit of claim 1, further comprising:
a first plurality of tile structures including the tile structure mutually connected via a first face of a tile-to-tile (T2T) bridge; and
a second plurality of tile structures mutually connected via a second face of the T2T bridge opposite the first face, wherein
each tile structure in the first plurality of tile structures and the second plurality of tile structures has a same configuration as the tile structure,
a number of tile structures in the first plurality of tile structures is 4N, a number of tile structures in the second plurality of tile structures is 4N, and N is an integer less than five.

9. The integrated circuit of claim 1, further comprising:
a first plurality of tile structures including the tile structure coupled to a first face of a tile-to-tile (T2T) bridge;
a second plurality of tile structures coupled to a second face of the T2T bridge opposite the first face, each tile structure in the first plurality of tile structures and the second plurality of tile structures having a same configuration as the tile structure;
a first stack of high bandwidth memories (HBMs) placed on the first face of the T2T bridge spatially between the tile structure and another tile structure of the first plurality of tile structures; and
a second stack of HBMs coupled to the second face.

10. The integrated circuit of claim 9, further comprising:
a heat sink coupled to outer surfaces of the first plurality of tile structures and the first stack of HBMs, the heat sink configured to dissipate heat at least from the first plurality of tile structures and the first stack of HBMs.

11. The integrated circuit of claim 1, wherein the integrated circuit comprises an M by N by K cuboid structure of a plurality of tile structures, each of the tile structures having a similar configuration as the tile structure, wherein the cuboid structure has a width of M tile structures, a length of N tile structures, and a height of K tile structures, and wherein M is a first integer greater than one, N is the first integer or a second integer greater than one, and K is the first integer, the second integer, or a third integer greater than one.

12. The integrated circuit of claim 11, wherein:
a first subset of the tile structures in the cuboid structure of the plurality of tile structures are coupled in a back-to-back (B2B) configuration via a first set of through-silicon via (TSV) connectors; and
a second subset of the tile structures in the cuboid structure of the plurality of tile structures are coupled in a face-to-back (F2B) configuration via a second set of TSV connectors.

13. The integrated circuit of claim 11, wherein the cuboid structure of the plurality of tile structures further comprises a plurality of heatsinks, each heatsink directly connected to at least one tile structure in the cuboid structure of the plurality of tile structures and configured to dissipate heat from the at least one tile structure.

14. The integrated circuit of claim 11, wherein the tile structures of the cuboid structure of the plurality of tile structures are configured to operate as the processor that enables model-parallelism across the tile structures, wherein the processor is a single core processor.

15. An integrated circuit, comprising:

a processor implemented via an array of tile structures, each tile structure in the array of tile structures comprises:

a first die comprising one or more matrix arithmetic functional units and one or more first stream registers configured to stream data in a first direction, and a second die connected to the first die in a face-to-face (F2F) configuration, wherein the second die comprises one or more matrix arithmetic functional units and one or more second stream registers configured to stream data in a second direction opposite the first direction, the one or more second stream registers are coupled to the one or more first stream registers, the first die and the second die overlap one another, the first die shifted relative to the second die by a first shift amount along a first dimension and by a second shift amount along a second dimension orthogonal to the first dimension forming an offset configuration between the first die and the second die, the overlap of the first die and the second die excludes portions of the first die and the second die that form a ledge and a shelf, wherein the F2F configuration forms the ledge that comprises a first plurality of electrical connection pads and the shelf that comprises a second plurality of electrical connection pads, and wherein at least one ledge overlaps with at least one shelf of an adjacent tile in the array of tile structures.

16. The integrated circuit of claim 15, wherein the array of tile structures comprises a two-dimensional M by N array of tile structures, wherein M is a first integer greater than one, and wherein N is the first integer or a second integer greater than one, a pair of tile structures in the two-dimensional array of tile structures being connected based on the offset configuration.

17. The integrated circuit of claim 15, wherein the processor enables model-parallelism across a plurality of dies of the tile structures.

18. The integrated circuit of claim 15, wherein the array of tile structures comprises an M by N by K cuboid tile structure, and at least a subset of the tile structures in the cuboid tile structure are coupled in a back-to-back (B2B) configuration via one or more through-silicon via (TSV) connectors, wherein M is a first integer greater than one, N is the first integer or a second integer greater than one, and K is the first integer, the second integer, or a third integer greater than one.

19. The integrated circuit of claim 18, wherein the cuboid tile structure is configured to function as the processor, and wherein the processor is a single core processor that enables model-parallelism across a plurality of dies of the cuboid tile structure.

20. An integrated circuit of a single core processor, comprising:

a first plurality of tile structures coupled to a first side of a tile-to-tile (T2T) bridge;

a second plurality of tile structures coupled to a second side of the T2T bridge opposite the first side, each tile structure in the first plurality of tile structures and the second plurality of tile structures comprises a first die and a second die connected in a face-to-face (F2F) configuration, the first die comprising one or more matrix arithmetic functional units and one or more first stream registers configured to stream data in a first direction, the second die comprising one or more matrix arithmetic functional units and one or more second stream registers configured to stream data in a second direction opposite the first direction, the one or more second stream registers are coupled to the one or more first stream registers, the first die shifted relative to the second die by a first shift amount along a first dimension and by a second shift amount along a second dimension orthogonal to the first dimension, wherein the F2F configuration forms a ledge that comprises a first plurality of electrical connection pads and a shelf that comprises a second plurality of electrical connection pads, wherein the first die and the second die overlap one another other than respective portions of the first die and the second die that form the ledge and the shelf, and wherein at least one ledge overlaps with at least one shelf of an adjacent tile in the first plurality of tile structures and the second plurality of tile structures;

a first stack of high bandwidth memories (HBMs) coupled to the first side;

a second stack of HBMs coupled to the second side; and a heat sink coupled to outer surfaces of the first plurality of tile structures and the first stack of HBMs.

* * * * *